US012597470B2

(12) United States Patent
Lee

(10) Patent No.: US 12,597,470 B2
(45) Date of Patent: Apr. 7, 2026

(54) ARCHITECTURE AND METHOD FOR NAND MEMORY OPERATION

(71) Applicant: Yangtze Memory Technologies Co., Ltd., Wuhan (CN)

(72) Inventor: Changhyun Lee, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 589 days.

(21) Appl. No.: 18/091,131

(22) Filed: Dec. 29, 2022

(65) Prior Publication Data

US 2023/0135415 A1 May 4, 2023

Related U.S. Application Data

(63) Continuation of application No. PCT/CN2021/098256, filed on Jun. 4, 2021.

(51) Int. Cl.
*G11C 16/10* (2006.01)
*G11C 16/04* (2006.01)
*G11C 16/08* (2006.01)

(52) U.S. Cl.
CPC .......... *G11C 16/10* (2013.01); *G11C 16/0483* (2013.01); *G11C 16/08* (2013.01)

(58) Field of Classification Search
CPC ....... G06F 3/0679; G11C 16/30; G11C 16/08; G11C 16/10; G11C 16/0483; G11C 16/3459; G11C 16/3404; G11C 16/3481
See application file for complete search history.

(56) References Cited

U.S. PATENT DOCUMENTS

| | | | | |
|---|---|---|---|---|
| 2007/0291542 A1* | 12/2007 | Aritome | ............. | G11C 16/3409 |
| | | | | 365/189.11 |
| 2008/0055995 A1* | 3/2008 | Ito | .......................... | G11C 16/12 |
| | | | | 365/185.28 |
| 2011/0261623 A1* | 10/2011 | Yang | ...................... | G11C 16/32 |
| | | | | 365/185.33 |

(Continued)

FOREIGN PATENT DOCUMENTS

CN 107564567 A 1/2018

OTHER PUBLICATIONS

Combined Chinese Office Action and Search Report issued on Apr. 26, 2022 in Chinese Patent Application No. 202180001860.5, citing reference 15 therein, 9 pages.

*Primary Examiner* — Jay W. Radke
(74) *Attorney, Agent, or Firm* — Oblon, McClelland, Maier & Neustadt, L.L.P.

(57) ABSTRACT

In a method for programming a memory cell string, a programming voltage is applied on a selected word line to program a selected memory cell of the memory cell string. A first pass voltage is applied on a first word line coupled to a first memory cell of the memory cells. A second pass voltage is applied on a second word line coupled to a second memory cell of the memory cells. Further, a third pass voltage is applied on a third word line coupled to a third memory cell of the memory cells. The first, second and third memory cells are located at a first side of the selected memory cell in the memory cell string, and the second memory cell is disposed between the first memory cell and the third memory cell. The second pass voltage is higher than the first pass voltage and the third pass voltage.

20 Claims, 10 Drawing Sheets

(56)                    References Cited

U.S. PATENT DOCUMENTS

| | | | |
|---|---|---|---|
| 2012/0331282 A1* | 12/2012 | Yurzola ................. | G06F 1/3203 |
| | | | 713/100 |
| 2013/0148430 A1* | 6/2013 | Shiino ................ | G11C 16/3459 |
| | | | 365/185.18 |
| 2016/0260483 A1* | 9/2016 | Shano .................. | G11C 29/848 |
| 2018/0005696 A1* | 1/2018 | Kwon .................... | G11C 16/30 |

* cited by examiner

500

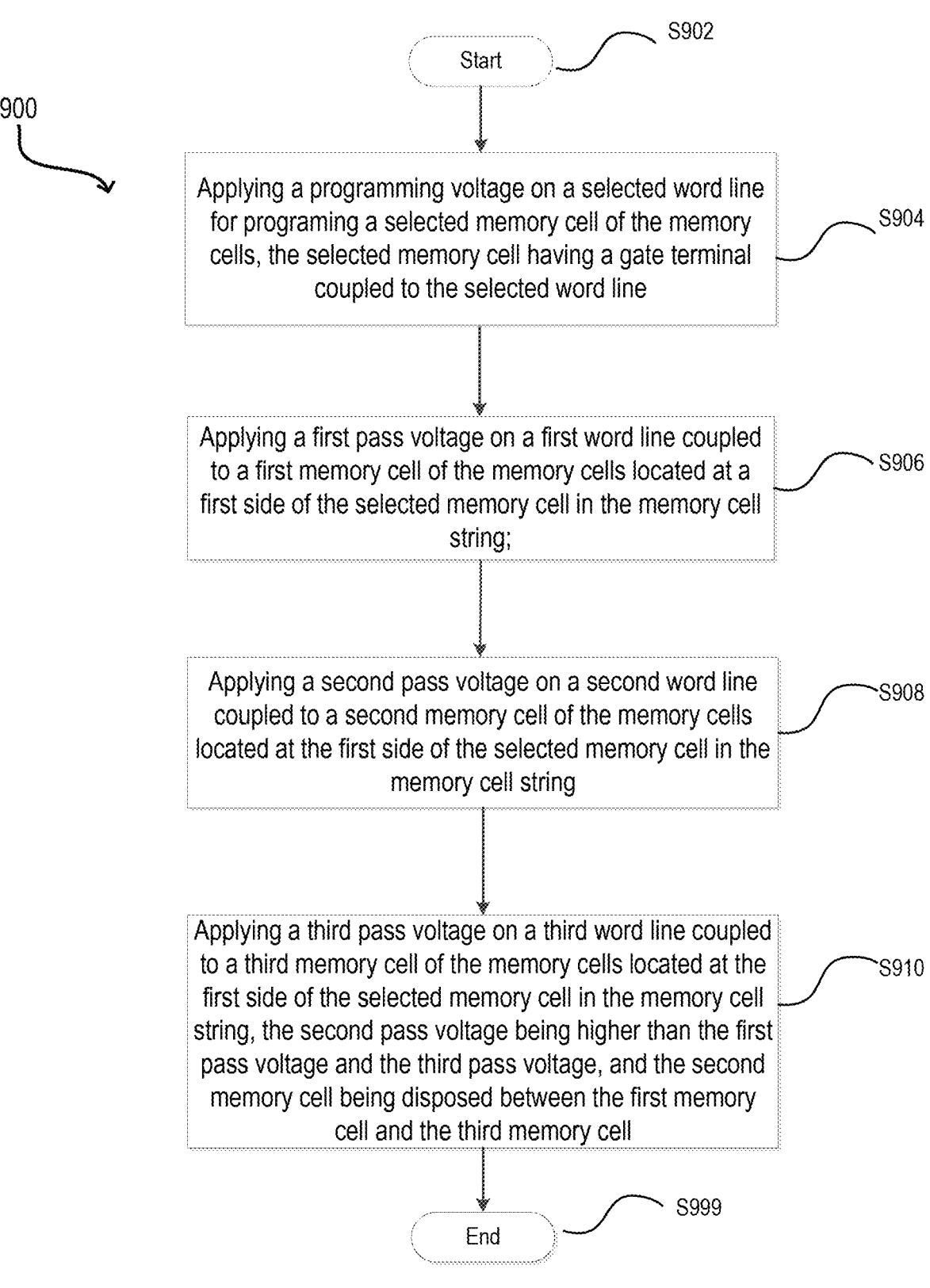

900

Start — S902

Applying a programming voltage on a selected word line for programing a selected memory cell of the memory cells, the selected memory cell having a gate terminal coupled to the selected word line — S904

Applying a first pass voltage on a first word line coupled to a first memory cell of the memory cells located at a first side of the selected memory cell in the memory cell string; — S906

Applying a second pass voltage on a second word line coupled to a second memory cell of the memory cells located at the first side of the selected memory cell in the memory cell string — S908

Applying a third pass voltage on a third word line coupled to a third memory cell of the memory cells located at the first side of the selected memory cell in the memory cell string, the second pass voltage being higher than the first pass voltage and the third pass voltage, and the second memory cell being disposed between the first memory cell and the third memory cell — S910

End — S999

*FIG. 9*

ARCHITECTURE AND METHOD FOR NAND MEMORY OPERATION

CROSS-REFERENCE TO RELATED APPLICATIONS

This application is a continuation of International Application No. PCT/CN2021/098256, filed on Jun. 4, 2021, entitled "ARCHITECTURE AND METHOD FOR NAND MEMORY OPERATION," which is hereby incorporated by reference in its entirety.

TECHNICAL FIELD

The present application describes embodiments generally related to semiconductor memory devices.

BACKGROUND

Semiconductor memory devices can be categorized into volatile memory devices and non-volatile memory devices. The volatile memory devices can lose data when power is off. The non-volatile memory devices can retain stored data even when power is disconnected. To achieve higher data storage density, semiconductor manufacturers developed vertical device technologies, such as three dimensional (3D) NAND flash memory technology, and the like. 3D NAND flash memory device is a kind of non-volatile memory device.

SUMMARY

Aspects of the disclosure provide a method for programming a memory device including a memory cell string. The memory cell string can include a bottom-select-gate (BAG) transistor, memory cells, and a top-select-gate (TSG) transistor that are connected in series. In the method, a programming voltage can be applied on a selected word line to program a selected memory cell of the memory cells, where the selected memory cell includes a gate terminal coupled to the selected word line. A first pass voltage can be applied on a first word line coupled to a first memory cell of the memory cells. The first memory cell can be located at a first side of the selected memory cell in the memory cell string. A second pass voltage can be applied on a second word line coupled to a second memory cell of the memory cells, where the second memory cell can be located at the first side of the selected memory cell in the memory cell string. Further, a third pass voltage can be applied on a third word line coupled to a third memory cell of the memory cells. The third memory cell can be located at the first side of the selected memory cell in the memory cell string. The second pass voltage can be higher than the first pass voltage and the third pass voltage, and the second memory cell can be disposed between the first memory cell and the third memory cell.

In an embodiment, the first memory cell, the second memory cell, and the third memory cell can be positioned between the selected memory cell and the BSG transistor. A pass voltage can further be applied on word lines coupled to the memory cells that are located at a second side of the selected memory cell in the memory cell string and disposed between the selected memory cell and the TSG transistor.

In another embodiment, the first memory cell, the second memory cell, and the third memory cell can be positioned between the selected memory cell and the TSG transistor. Accordingly, the pass voltage can be applied on word lines coupled to the memory cells that are located at the second side of the selected memory cell in the memory cell string and disposed between the selected memory cell and the BSG transistor.

In the method, the first pass voltage can be applied on a fourth word line coupled to a fourth memory cell of the memory cells, where the fourth memory cell can be located at a second side of the selected memory cell in the memory cell string. The second pass voltage can be applied on a fifth word line coupled to a fifth memory cell of the memory cells, where the fifth memory cell can be located at the second side of the selected memory cell in the memory cell string. The third pass voltage can be applied on a sixth word line coupled to a sixth memory cell of the memory cells, where the sixth memory cell can be located at the second side of the selected memory cell in the memory cell string. The fifth memory cell can be disposed between the fourth memory cell and the sixth memory cell. In addition, the first memory cell, the second memory cell, and the third memory cell can be disposed between the selected memory cell and the BSG transistor. The fourth memory cell, the fifth memory cell, and the sixth memory cell can be disposed between the selected memory cell and the TSG transistor.

In the method, an interface pass voltage can be applied on a first interface word line coupled to a first interface memory cell. The first interface memory cell can be located at the first side of the selected memory cell and disposed between the second memory cell and the third memory cell. Further, the interface pass voltage can be applied on a second interface word line coupled to a second interface memory cell. The second interface memory cell can be located at the second side of the selected memory cell and disposed between the fifth memory cell and the sixth memory cell.

In some embodiments, the interface pass voltage can be in a range between the second pass voltage and the third pass voltage.

In the method, a transition pass voltage can be applied on a first transition word line coupled to a first transition memory cell. The first transistor memory can be located at the first side of the selected memory cell and disposed between the second memory cell and the first interface memory cell. The transition pass voltage can further be applied on a second transition word line coupled to a second transition memory cell. The second transition memory cell can be located at the second side of the selected memory cell and disposed between the fifth memory cell and the second interface memory cell.

In some embodiments, the transition pass voltage can be less than the second pass voltage. The first pass voltage can be in a range from 3 volts to 9 volts. The second pass voltage can be in a range from 7 volts to 13 volts. The third pass voltage can be in a range from 5 volts to 11 volts. The programming voltage can be in a range from 15 volts to 23 volts. The interface pass voltage can be in a range from 8 volts to 10 volts. The transition pass voltage can be in a range from 5 volts to 12 volts.

According to another aspect of the disclosure, a memory device is provided. The memory device can include a memory cell string, where the memory cell string includes a bottom-select-gate (BSG) transistor, memory cells including a selected memory cell, and a top-select-gate (TSG) transistor that are connected in series. The memory device can also include a voltage generator coupled to the memory cell string, and a controller. The controller is configured to apply a programming voltage generated by the voltage generator through an address decoding circuit on a selected word line for programing the selected memory cell of the memory cells. The selected memory cell includes a gate terminal coupled to the selected word line. The controller can apply a first pass voltage generated by the voltage generator through the address decoding circuit on a first word line coupled to a first memory cell of the memory cells. The controller can further apply a second pass voltage generated by the voltage generator through the address decoding circuit on a second word line coupled to a second memory cell of the memory cells. The controller can apply a third pass voltage generated by the voltage generator through the address decoding circuit on a third word line coupled to a third memory cell of the memory cells. The first memory cell, the second memory cell, and the third memory cell can be located at the first side of the selected memory cell in the memory cell string. The second pass voltage can be higher than the first pass voltage and the third pass voltage, and the second memory cell can be disposed between the first memory cell and the third memory cell.

In an embodiment, when the first memory cell, the second memory cell, and the third memory cell are positioned between the selected memory cell and the BSG transistor, the controller can be further configured to apply a pass voltage generated by the voltage generator through the address decoding circuit on word lines coupled to the memory cells that are located at a second side of the selected memory cell in the memory cell string and disposed between the selected memory cell and the TSG transistor.

In another embodiment, when the first memory cell, the second memory cell, and the third memory cell are positioned between the selected memory cell and the TSG transistor, the controller can be further configured to apply the pass voltage generated by the voltage generator through the address decoding circuit on word lines coupled to the memory cells that are located at the second side of the selected memory cell in the memory cell string and disposed between the selected memory cell and the BSG transistor.

In some embodiments, the controller can further be configured to apply the first pass voltage through the address decoding circuit on a fourth word line coupled to a fourth memory cell of the memory cells. The controller can apply the second pass voltage through the address decoding circuit on a fifth word line coupled to a fifth memory cell of the memory cells. The controller can apply the third pass voltage through the address decoding circuit on a sixth word line coupled to a sixth memory cell of the memory cells. The fourth memory cell, the fifth memory cell, and the sixth memory cell can be located at the second side of the selected memory cell in the memory cell string. The fifth memory cell can be disposed between the fourth memory cell and the sixth memory cell. In addition, the first memory cell, the second memory cell, and the third memory cell can be disposed between the selected memory cell and the BSG transistor. The fourth memory cell, the fifth memory cell, and the sixth memory cell can be disposed between the selected memory cell and the TSG transistor.

In some embodiments, the controller can further be configured to apply an interface pass voltage generated by the voltage generator through the address decoding circuit on a first interface word line coupled to a first interface memory cell. The first interface memory cell can be located at the first side of the selected memory cell and disposed between the second memory cell and the third memory cell. The controller can also apply the interface pass voltage through the address decoding circuit on a second interface word line coupled to a second interface memory cell. The second interface memory cell can be located at the second side of the selected memory cell and disposed between the fifth memory cell and the sixth memory cell. Moreover, the interface pass voltage can be in a range between the second pass voltage and the third pass voltage.

In some embodiments, the controller can be configured to apply a transition pass voltage generated by the voltage generator through the address decoding circuit on a first transition word line coupled to a first transition memory cell. The first transition memory cell can be located at the first side of the selected memory cell and disposed between the second memory cell and the first interface memory cell. The controller can apply the transition pass voltage through the address decoding circuit on a second transition word line coupled to a second transition memory cell, where the second transition memory cell can be located at the second side of the selected memory cell and disposed between the fifth memory cell and the second interface memory cell.

In some embodiments, the transition pass voltage can be less than the second pass voltage. The first pass voltage can be in a range from 3 volts to 9 volts. The second pass voltage can be in a range from 7 volts to 13 volts. The third pass voltage can be in a range from 5 volts to 11 volts. The programming voltage can be in a range from 15 volts to 23 volts. The interface pass voltage can be in a range from 8 volts to 10 volts. The transition pass voltage can be in a range from 5 volts to 12 volts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 9 shows a flow chart outlining a method for programming a semiconductor memory device according to some exemplary embodiments of the disclosure.

US 12,597,470 B2

5

DETAILED DESCRIPTION

Figure 1:
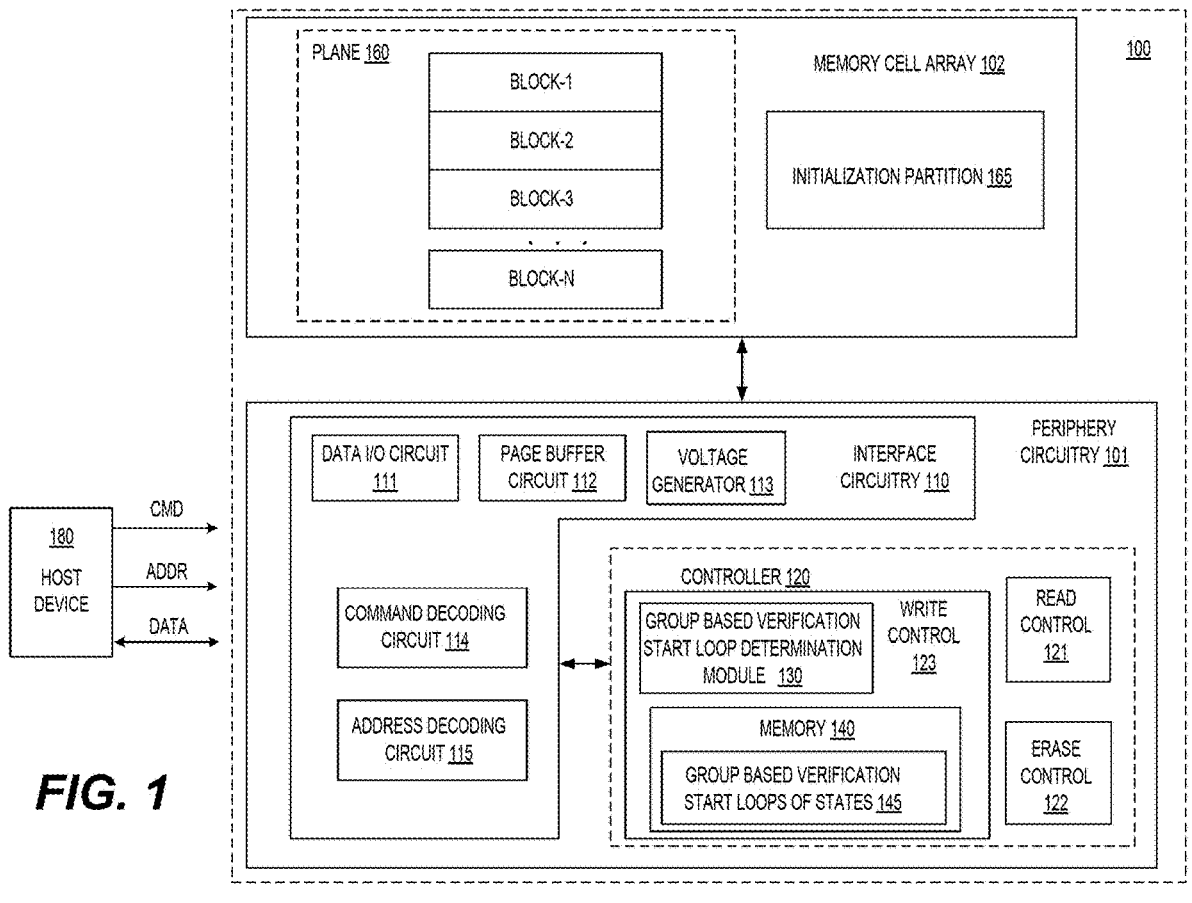
FIG. 1 shows a block diagram of a semiconductor memory device according to some exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide semiconductor memory devices and techniques for operating the semiconductor memory devices. Generally, a semiconductor memory device includes a memory cell array portion and a peripheral circuitry portion. The peripheral circuitry portion interfaces the memory cell array portion with external circuitry and provides various controls (e.g., writing/programming, erasing, and reading) to the memory cell array portion.

According to some aspects of the disclosure, the memory cell array portion includes memory cells that are configured to store multiple binary bits in each memory cell. Generally, a memory cell can be configured into two states to store a binary bit, and can be configured into more than two states to store multiple binary bits. In an example, each memory cell is configured to store two binary bits, and the memory cell can be configured into four states based on a threshold voltage of the memory cell. For example, the memory cell can be erased and have a threshold voltage in a first range (e.g., [−3V, −1V]) that corresponds to a first state (e.g., binary "11") of the two bits; the memory cell can be programed to have a threshold voltage in a second range (e.g., [0V, 1V]) that corresponds to a second state (e.g., binary "01") of the two bits; the memory cell can be programmed to have a threshold voltage in a third range (e.g., [1V, 2V]) that corresponds to a third state (e.g., binary "10") of the two bits; and the memory cell can be programed to have a threshold voltage in a fourth range (e.g., [2V, 3V]) that corresponds to a fourth state (e.g., binary "00") of the two bits.

It is noted that while two binary bits are used in some examples in the present disclosure, the present disclosure is not limited to the two binary bits. In some examples, each memory cell can be similarly configured to store another suitable number of binary bits, such as three bits, four bits, and the like.

According to an aspect of the disclosure, the multiple binary bits can be written/programmed to a selected memory cell using program-verify loops. Each program-verify loop includes a program step, and a verification step. In the program step, a programing pulse (e.g., having a pulse voltage higher than 18V) can be applied to the gate terminal of the memory cell with other suitable biases to suitably increase the threshold voltage, for example, by injecting electrons into a floating gate of the memory cell. In the verification step, verification voltages can be applied to the gate terminals with other suitable biases to determine whether the threshold voltage of the memory cell is in the appropriate range. When the threshold voltage is out of the appropriate range at the lower side (e.g., the memory cell is turned off in response to a verification voltage), another program-verify loop can be executed. The program-verify loops can be performed until the threshold voltage of the memory cell is in the appropriate range (e.g., the memory cell is turned on in response to a verification voltage). In some examples, the voltage level of the programming pulse can be adjusted, such as using the incremental step pulse programming (ISPP) technique.

In order to prevent other memory cells from being programmed when the selected memory cell is programmed, where the other memory cells can be connected to the selected memory cell in series, a program inhibit operation or boosting operation can be applied to the other memory cells. For example, voltage potentials of source/drain regions of the other memory cells can be boosted up to a higher value (e.g., 6-8V) to reduce the field across the channel regions of the other memory cells. In another example shown in FIG. 3, a local-boosting operation can be applied that can electrically isolate charge sharing of channels between the selected memory cell and the other memory cells.

FIG. 1 shows a block diagram of a semiconductor memory device 100 according to some embodiments of the disclosure. The semiconductor memory device 100 includes a memory cell array 102 and peripheral (also referred to as periphery) circuitry 101 coupled together. In some examples, the memory cell array 102 and the peripheral circuitry 101 are disposed on a same die (chip). In other examples, the memory cell array 102 is disposed on an array die, the peripheral circuitry 101 is disposed on a different die, such as a die that is implemented using complementary metal-oxide-semiconductor (CMOS) technology and is referred to as CMOS die. The array die and the CMOS die are suitably bonded, and electrically coupled together. An example of bonded array die and CMOS die will be described with reference to FIG. 2.

In some examples, a CMOS die can be coupled with multiple array dies. In an embodiment, the semiconductor memory device 100 is an integrated circuit (IC) package that encapsulates one or more array dies and one or more CMOS dies.

The semiconductor memory device 100 is configured to store data in the memory cell array 102, and perform operations in response to received commands (CMD). In some examples, the semiconductor memory device 100 can receive a write command (also referred to as program command in some examples), a read command, an erase command and the like, and operate accordingly. In an example, the semiconductor memory device 100 receives a write command with an address (ADDR) and data (DATA), the semiconductor memory device 100 then stores the data in the memory cell array 102 at the address. In another example, the semiconductor memory device 100 receives a read command with an address, the semiconductor memory device 100 then accesses the memory cell array 102, and outputs data stored at the address of the memory cell array 102. In another example, the semiconductor memory device 100 receives an erase command with an address, the semiconductor memory device 100 then resets one or more blocks of memory cells at the address to an un-programmed state (also referred to erased state), such as "1" in 1-bit, "11" in 2-bit, "111" in 3-bit, and the like in the NAND flash memory technology.

Generally, the memory cell array 102 can include one or more memory planes 160, and each of memory planes 160 can include a plurality of memory blocks, such as block-1 to block-N as shown in FIG. 1. In some examples, concurrent operations can take place at different memory planes 160. In some embodiments, each of the memory blocks block-1 to block-N is the smallest unit to carry out an erase operation. Each memory block includes a number of pages. In some examples, a page is the smallest unit that can be programmed. In an example, memory cells of a page can share a word line.

In some embodiments, the memory cell array 102 is a flash memory array, and is implemented using 3D NAND flash memory technology. Each of the memory blocks block-1 to block-N includes a plurality of memory cell strings that are disposed vertically (e.g., perpendicular to a main surface of a die). Each memory cell string includes a plurality of transistors connected in series. The details of the memory cell string can be described with reference to FIG. 2.

In some embodiments, the peripheral circuitry 101 includes an interface circuitry 110 and a controller 120 coupled together.

The interface circuitry 110 includes suitable circuitry to interface with the memory cell array 102 or to interface with external components of the semiconductor memory device 100, such as a host device 180. In some examples, the interface circuitry 110 includes a first portion that interfaces with the host device 180 and is referred to as a host interface, and a second portion that interfaces with the memory cell array 102 and is referred to as an array interface. In the FIG. 1 example, the interface circuitry 110 includes a command decoding circuit 114, an address decoding circuit 115, a page buffer circuit 112, a data input/output (I/O) circuit 111, and a voltage generator 113 coupled together as shown in FIG. 1.

In some examples, the address decoding circuit 115 can receive address (ADDR) from I/O pins coupled to external circuitry (e.g., the host device 180) and perform decoding of the address. In some examples, the address decoding circuit 115 can operate with the controller 120 to perform decoding of the address. In some embodiments, the received addresses from the host device 180 are file system logical block addresses. In some examples, the address decoding circuit 115 and the controller 120 can perform functions of a flash translation layer (FTL) to translate from block addresses used by a file system to addresses of physical cells in the memory cell array 102. In an example, the translation from block addresses used by the file system to physical cells in the memory cell array 102 can be used to exclude bad memory cells. In some embodiments, the addresses of the physical cells are in the form of row address (R-ADDR) and column address (C-ADDR). In response to the row address, the address decoding circuit 115 can generate the word line (WL) signals and select signals, such as top select gate (TSG) signal(s), bottom select gate (BSG) signal(s), and the like based on the row address and provide the memory cell array 102 with the WL signals, and select signals. In some examples, during a write operation, the address decoding circuit 115 provides the WL signals and the select signals to the memory cell array 102 to select a page to program. During a read operation, the address decoding circuit 115 can provide the WL signals and the select signals to select a page for buffering. During an erase operation, the address decoding circuit 115 can provide suitable WL signals and select signals.

The page buffer circuit 112 is coupled to bit lines (BLs) of the memory cell array 102 and is configured to buffer data, such as one or more pages of data during read and write operations. In an example, during a write operation, the page buffer circuit 112 can buffer data to be programed and drive the data to bit lines of the memory cell array 102 to write the data into the memory cell array 102. In another example, during a read operation, the page buffer circuit 112 can sense data on the bit lines of the memory cell array 102 and buffer the sensed data for outputting.

In some embodiments, the page buffer circuit 112 includes latch circuits associated with bit lines. Values in the latch circuits can indicate programming status. For example, during a write operation that writes data to a memory cell in a memory string connected with a bit line, when program-verify loops are used, a latch circuit associated with the bit line can switch values, such as switch from "0" to "1" in response to a turn on of the memory cell (e.g., the memory cell is sufficiently programmed) in a verification step of the program-verify loops. When the latch circuit has the switched value (e.g., "1"), further programming is inhibited to the memory cell. In some examples, the latch circuits can maintain the switched values (e.g., "1") for the rest of the write operation. In an example, when all the latch circuits have the value "1", data in the page buffer circuit 112 (e.g., a page data) has been written to the memory cell array 102.

In the FIG. 1 example, the data I/O circuit 111 is coupled to the page buffer circuit 112 via data lines (DL). In an example (e.g., during a write operation), the data I/O circuit 111 is configured to receive data from external circuitry (e.g., the host device 180) of the semiconductor memory device 100, and provide the received data to the memory cell array 102 via the page buffer circuit 112. In another example (e.g., during a read operation), the data I/O circuit 111 is configured to output the data from the memory cell array 102 to external circuitry (e.g., host device 180) based on the column address (C-ADDR).

The voltage generator 113 is configured to generate voltages of suitable levels for the proper operations of the semiconductor memory device 100. For example, during a read operation, the voltage generator 113 can generate voltages of suitable levels such as for source voltages, body voltage, various WL voltages, select voltages, and like for the read operation. In some examples, the source voltages are provided as array common source (ACS) voltages to the source terminals of the memory cell array 102 during the read operation; the body voltage is provided to, for example a P-type well (PW) that is the body portion for the memory cell strings, during the read operation. The WL voltages and the select voltages are provided to the address decoding circuit 115, thus the address decoding circuit 115 can output the WL signals and the select signals (e.g. TSG signals and BSG signals) at the suitable voltage level during the read operation.

In another example, during an erase operation, the voltage generator 113 can generate voltages of suitable levels such as for source voltages, body voltage, various WL voltages, select voltages, BL voltages and like that are suitable for the erase operation. In some examples, the source voltages are provided as ACS voltages to the source terminals of the memory cell array 102 during the erase operation; the PW voltage is provided to the P-type well that is the body portion for the memory cell strings during the erase operation. The WL voltages and the select voltages are provided to the address decoding circuit 115, thus the address decoding circuit 115 can output the WL signals and the BSG and TSG signals at the suitable voltage level during the erase operation. The BL voltages are provided to the page buffer circuit 112, thus the page buffer circuit 112 can drive the bit lines (BL) at proper voltage levels during the erase operation. It is noted that the BL voltage may be applied to the bit lines without going through the page buffer circuit 112 in some examples.

In another example, during a write operation, the voltage generator 113 can generate voltages of suitable levels such as for source voltages, body voltage, various WL voltages, select voltages, BL voltages, verification voltages, reference voltages and like that are suitable for the write operation. In some examples, the source voltage is provided as ACS voltages to the source terminals of the memory cell array 102 during the write operation; the PW voltage is provided to the P-type well that is the body portion for the memory cell strings during the write operation. The WL voltages, the select voltages, and verification voltages are provided to the address decoding circuit 115, thus the address decoding circuit 115 can output the WL signals and the BSG and TSG signals at the suitable voltage levels during the write operation. The BL voltages and the reference voltages are provided to the page buffer circuit 112, thus the page buffer circuit 112 can drive the bit lines (BLs) at proper voltage levels during the write operation, and can sense programming status in the verification steps during the write operation.

In some embodiments, the command decoding circuit 114 is configured to receive commands (CMD) from, for example the host device 180 via I/O pins in command cycles. In some embodiments, the I/O pins can transmit other information, such as addresses in address cycles, data in data cycles. In some embodiments, the received commands are commands according to certain high level protocols (e.g., USB protocols).

In some embodiments, the command decoding circuit 114 and the controller 120 can operate together to decode the received commands. In an example, the command decoding circuit 114 performs initial decoding of the received commands and the decoded commands by the command decoding circuit 114 are provided to the controller 120 for further processing. The controller 120 can perform further decoding, and then generate control parameters for controlling other circuits, such as the page buffer circuit 112, the data I/O circuit 111, the voltage generator 113, and the like based on the commands.

In some embodiments, the controller 120 can control the voltage generator 113 to generate voltages of suitable levels based on the commands. The controller 120 can coordinate the other circuits, to provide signals to the memory cell array 102 at the suitable time and suitable voltage levels.

In the FIG. 1 example, the controller 120 includes a read control 121, an erase control 122, and a write control 123. In an example, in response to a read command, the read control 121 can generate control parameters for generating control signals to read data from the memory cell array 102. In another example, in response to a write command, the write control 123 can generate control parameters for generating control signals to write data to the memory cell array 102. In another example, in response to an erase command, the erase control can generate control parameters for generating control signals to erase one or more blocks of the memory cell array 102.

The controller 120 can be implemented using any suitable techniques.

In some examples, the controller 120 is implemented as a microcontroller unit (MCU) (not shown) and a firmware (FW) memory (not shown). The MCU can include one or more processing cores, the FW memory stores firmware that can be executed by the one or more processing cores. For example, the firmware includes a read module, a write module and an erase module. The MCU can execute the read module to perform functions of the read control 121. The MCU can execute the write module to perform functions of the write control 123. The MCU can execute the erase module to perform functions of the erase control 122.

It is noted that FW memory can be implemented using any suitable non-volatile memory that can retain stored data even when power is disconnected. In an example, the FW memory is implemented using read-only memory (ROM). In another example, the FW memory is implemented using programmable ROM. In another example, the FW memory is implemented using erasable programmable ROM.

In some embodiments, the controller 120 can be implemented using logic circuits. In some examples, some portions of the controller 120 or the whole controller 120 can be implemented by logic circuits that can have much faster processing speed than firmware based implementation. In an example, some functions of the controller 120 can be implemented using programmable logic cells that provide a flexible development schedule and fast processing speed.

According to some aspects of the disclosure, the write control 123 is configured to determine verification start loops of states (e.g., states for programming multiple binary bits in a memory cell), based on sensing results from programming to one or more word lines in a word line group. The determined verification start loops of states can be stored in association with the word line group. Then, for later programing to word lines in the word line group, the write control 123 can use program-verify loops with the verification start loops of the states.

In some embodiments, the write control 123 includes a group based verification start loop determination module 130 and a memory 140 (or an allocated memory space in a memory). In an embodiment, the group based verification start loop determination module 130 is configured to detect a first write to a word line in a word line group (e.g., after a power up of the semiconductor memory device 100), and use default verification start loops of the states (e.g., earliest verification start loops of the states) to perform first program-verify loops and write data to the word line. Further, the group based verification start loop determination module 130 can monitor results, such as sensing results, values in the latch circuits of the page buffer circuit 112, and the like, and determine updated verification start loops of the states. The updated verification start loops of the states can be stored in the memory 140 in association with the word line group, such as group based verification start loops of states 145 in FIG. 1. Thus, later on, for further writes to word lines (e.g., the same word line as the first write, or other word lines) in the word line group, the updated verification start loops of the states can be used to perform program-verify loops for writing to the word lines.

The updated verification start loops of states can be determined based on various suitable techniques. In some examples, at each program-verify loop of the first program-verify loops, a total number of turn-on memory cells (e.g., sufficiently programmed memory cells) of the word line can be counted for each state, for example based on values in the latch circuits of the page buffer circuit 112. At a specific program-verify loop, when the total number of turn-on memory cells of a state is increased to be equal to or larger than a threshold, the specific program-verify loop can be determined to be the updated verification start loop of the state.

According to an aspect of the disclosure, word lines of similar program speed can form a word line group. Thus, when verification start loops of states are determined based on a write to one of the word lines in the word line group, the determine verification start loops of states can be used in program-verify loops to write to any word lines in the word line group in an example. In some examples, program speed of memory cells at different word lines can be characterized by the manufacturer of the semiconductor memory devices, then word lines can be divided into word line groups based on the program speed characterization.

In some examples, a word line group can be defined using addresses of the word lines in the word line group. The definition of word line groups can be suitably stored on each of the semiconductor memory devices. In an example, the definition of the word line groups can be stored in a special partition of the memory cell array 102. For example, the memory cell array 102 includes an initialization partition 165. The initialization partition 165 is a portion of the memory cell array 102 that can be loaded to the peripheral circuitry 101 at a time when the semiconductor memory device 100 is powered up. In some examples, at the time of power up, information in the initialization partition 165 is loaded into the peripheral circuitry 101 to configure the peripheral circuitry 101. In an example, the definition of the word line groups can be stored in the initialization partition 165 and loaded to the peripheral circuitry 101 at the time of power up. In another example, the definition of the word line groups can be implemented in firmware explicitly or implicitly. In some embodiments, the definition of the word line groups is stored in a non-volatile form, thus the definition of the word line groups will not be lost when power is disconnected.

In some examples, word line groups can be block based, and each word line group includes one or more blocks, such as one or more of BLOCK-1 TO BLOCK-N in FIG. 1. In some examples, word line groups can be word line based, and each word line group includes multiple word lines. In another example, word line groups can be single word line based, and each word line group includes a single word line.

In some embodiments, the determined verification start loops of states can be stored in a volatile form. In an example, the memory 140 is implemented using static random access memory (SRAM). In another example, the memory 140 is implemented using suitable register circuits. Then, after each power on, verification start loops of states can be re-determined and stored. Thus, when the program speed changes, such as due to increase of PE cycles, the verification start loops for states can be re-determined at each power on time to compensate for the change of the program speed.

It is noted that, in some examples, the group based verification start loop determination module 130 is implemented as firmware to be executed by processors; in some other examples, the group based verification start loop determination module 130 is implemented using circuits.

Figure 2:
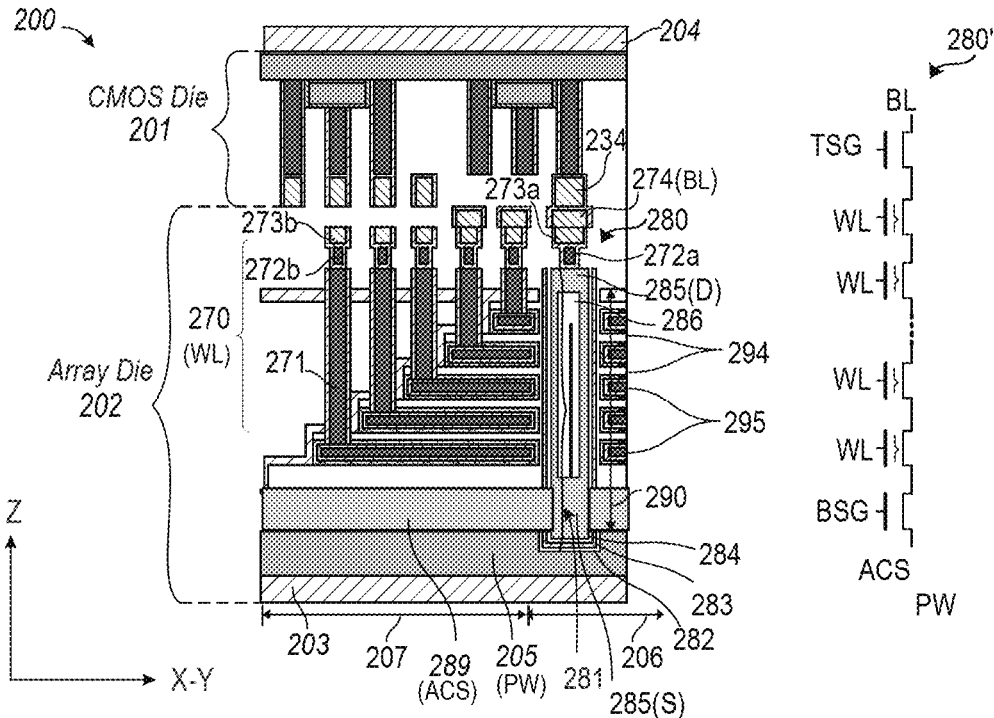
FIG. 2 shows a cross-sectional view of a semiconductor memory device, and a schematic symbol of a memory cell string according to some exemplary embodiments of the disclosure.

FIG. 2 shows a cross-sectional view of a semiconductor memory device 200 according to some embodiments of the disclosure. The semiconductor memory device 200 can be the semiconductor memory device 100 in some examples. The semiconductor memory device 200 includes an array die 202 and a CMOS die 201 bonded together according to some embodiments of the disclosure.

It is noted that, in some embodiments, a semiconductor memory device can include multiple array dies and a CMOS die. The multiple array dies and the CMOS die can be stacked and bonded together. The CMOS die is respectively coupled to the multiple array dies, and can drive the respective array dies to operate in a similar manner as the semiconductor memory device 200.

The array die 202 includes a substrate 203, and memory cells formed on the substrate 203. The CMOS die 201 includes a substrate 204, and peripheral circuitry formed on the substrate 204. For simplicity, the main surface of the substrate 203 is referred to as an X-Y plane, and the direction perpendicular to the main surface is referred to as a Z direction (or Z axis).

The substrate 203 and the substrate 204 respectively can be any suitable substrate, such as a silicon (Si) substrate, a germanium (Ge) substrate, a silicon-germanium (SiGe) substrate, and/or a silicon-on-insulator (SOI) substrate. The substrate 203 and the substrate 204 respectively may include a semiconductor material, for example, a Group IV semiconductor, a Group III-V compound semiconductor, or a Group II-VI oxide semiconductor. The Group IV semiconductor may include Si, Ge, or SiGe. The substrate 203 and the substrate 204 respectively may be a bulk wafer or an epitaxial layer.

The semiconductor memory device 200 includes memory cell arrays (e.g., memory cell array 102) and peripheral circuitry (e.g., the address decoding circuit, the page buffer circuit, the data I/O circuit, the voltage generator, the main controller, and the like). In the FIG. 2 example, the memory cell arrays are formed on the substrate 203 of the array die 202 and the peripheral circuitry is formed on the substrate 204 of the CMOS die 201. The array die 202 and the CMOS die 201 are disposed face to face (the surface with circuitry disposed thereon is referred to as face, and the opposite surface is referred to as back), and bonded together.

In some examples, wells can be formed in the substrate 203 respectively for blocks as body portions for the blocks. In the FIG. 2 example, a P-type well 205 is formed in the substrate 203, and a block of three dimensional (3D) NAND memory cell strings can be formed in the P-type well 205. The P-type well 205 can form a body portion (e.g., in connection with a PW terminal) for the 3D NAND memory cell strings, and a voltage that is referred to as PW can be applied to the P-type well 205 via the PW terminal. In some examples, the memory cell array is formed in a core region 206 as an array of vertical memory cell strings. Besides the core region 206 and the periphery region, the array die 202 includes a staircase region 207 (also referred to as a connection region in some examples) to facilitate making connections to, for example, gates of the memory cells in the vertical memory cell strings, gates of the select transistors, and the like. The gates of the memory cells in the vertical memory cell strings correspond to word lines for the NAND memory architecture.

In the FIG. 2 example, a vertical memory cell string 280 is shown as a representation of an array of vertical memory cell strings formed in the core region 206. FIG. 2 also shows a schematic symbol version of the vertical memory cell string 280' corresponding to the vertical memory cell string 280. The vertical memory cell strings 280 are formed in a stack of layers 290. The stack of layers 290 includes gate layers (or word line layers) 295 and insulating layers 294 that are stacked alternatingly. The gate layers 295 and the insulating layers 294 are configured to form transistors that are stacked vertically. In some examples, the stack of transistors includes memory cells and select transistors, such as one or more bottom select transistors (also referred to as bottom-select-gate transistors), one or more top select transistors (also referred to as top-select-gate transistors), and the like. In some examples, the stack of transistors can include one or more dummy select transistors. The gate layers 295 correspond to gates of the transistors. The gate layers 295 are made of gate stack materials, such as high dielectric constant (high-k) gate insulator layers, metal gate (MG) electrode, and the like. The insulating layers 294 are made of insulating material(s), such as silicon nitride, silicon dioxide, and the like.

According to some aspects of the disclosure, the vertical memory cell strings are formed of channel structures 281 that extend vertically (Z direction) into the stack of layers 290. The channel structures 281 can be disposed separately from each other in the X-Y plane. In some embodiments, the channel structures 281 are disposed in the form of arrays between gate line cut structures (not shown). The gate line cut structures are used to facilitate replacement of sacrificial layers with the gate layers 295 in a gate-last process. The arrays of the channel structures 281 can have any suitable array shape, such as a matrix array shape along the X direction and the Y direction, a zig-zag array shape along the X or Y direction, a beehive (e.g., hexagonal) array shape, and the like. In some embodiments, each of the channel structures has a circular shape in the X-Y plane, and a pillar shape in the X-Z plane and Y-Z plane. In some embodiments, the quantity and arrangement of the channel structures between gate line cut structures is not limited.

In some embodiments, the channel structure 281 can have a pillar shape that extends in the Z direction that is perpendicular to the direction of the main surface of the substrate 203. In an embodiment, the channel structure 281 is formed by materials in the circular shape in the X-Y plane, and extends in the Z direction. For example, the channel structure 281 includes function layers, such as a blocking insulating layer 282 (e.g., silicon oxide), a charge storage layer (e.g., silicon nitride) 283, a tunneling insulating layer 284 (e.g., silicon oxide), a semiconductor layer 285, and an insulating layer 286 that have the circular shape in the X-Y plane, and extend in the Z direction. In an example, the blocking insulating layer 282 (e.g., silicon oxide) is formed on the sidewall of a hole (into the stack of layers 290) for the channel structure 281, and then the charge storage layer (e.g., silicon nitride) 283, the tunneling insulating layer 284, the semiconductor layer 285, and the insulating layer 286 are sequentially stacked from the sidewall. The semiconductor layer 285 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 286 is formed of an insulating material, such as silicon oxide and/or silicon nitride, and/or may be formed as an air gap.

According to some aspects of the disclosure, the channel structure 281 and the stack of layers 290 together form the memory cell string 280. For example, the semiconductor layer 285 corresponds to the channel portions for transistors in the memory cell string 280, and the gate layers 295 correspond to the gates of the transistors in the memory cells string 280. Generally, a transistor has a gate that controls a channel, and has a drain and a source at each side of the channel. For simplicity, in the FIG. 2 example, the upper side of the channel for transistors in FIG. 2 is referred to as the drain, and the bottom side of the channel for transistors in FIG. 2 is referred to as the source. It is noted that the drain and the source can be switched under certain driving configurations. In the FIG. 2 example, the semiconductor layer 285 corresponds to connected channels of the transistors. For a specific transistor, the drain of the specific transistor is connected with a source of an upper transistor above the specific transistor, and the source of the specific transistor is connected with a drain of lower transistor below the specific transistor. Thus, the transistors in the memory cell string 280 are connected in series.

The memory cell string 280 includes memory cell transistors (or referred to as memory cells). A memory cell transistor can have different threshold voltages based on carrier trappings in a portion of the charge storage layer 283 that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programed state (also referred to as erased state) corresponding to logic "11" in two binary bits. When holes are expelled from the floating gate (or electrons are trapped in the floating gate), the threshold voltage of the memory cell transistor is increased, thus the memory cell transistor can be programmed to other suitable states, such as S2, S3, and the like.

The memory cell string 280 includes one or more top select transistors configured to couple/de-couple the memory cells in the memory cell string 280 to a bit line, and includes one or more bottom select transistors configured to couple/de-couple the memory cells in the memory cell string 280 to the ACS.

The top select transistors are controlled by top select gates (TSG). For example, when a TSG voltage (voltage applied to the TSG) is larger than a threshold voltage of the top select transistors, the top select transistors are turned on and the memory cells are coupled to the bit line; and when the TSG voltage (voltage applied to the TSG) is smaller than the threshold voltage of the top select transistors, the top select transistors are turned off and the memory cells are de-coupled from the bit line.

Similarly, the bottom select transistors are controlled by bottom select gates (BSG). For example, when a BSG voltage (voltage applied to the BSG) is larger than a threshold voltage of the bottom select transistors, the bottom select transistors are turned on and the memory cells are coupled to the ACS; and when the BSG voltage (voltage applied to the BSG) is smaller than the threshold voltage of the bottom select transistors, the bottom select transistors are turned off and the memory cells are de-coupled to the ACS.

According to some aspects of the disclosure, the bottom portion of the semiconductor layer 285 in the channel hole corresponds to a source side of the vertical memory cell string 280, and the bottom portion is labeled as 285(S). A common source layer 289 is formed in conductive connection with the source of the vertical memory cell string 280. The common source layer 289 can includes one or more layers. In some examples, the common source layer 289 includes silicon material, such as intrinsic polysilicon, doped polysilicon (such as N-type doped silicon, P-type doped silicon), and the like. In some examples, the common source layer 289 may include metal silicide to improve conductivity. The common source layer 289 is similarly in conductive connection with sources of other vertical memory cell strings (not shown), and thus forms an array common source (ACS).

In some examples, when the vertical memory cell strings 280 are configured to be erased on a block basis, the common source layer 289 can extend and cover the core regions of a block and staircase regions for the block. In some examples, for different blocks that are erased separately, the common source layer 289 may be suitably insulated for the different blocks.

In the FIG. 2 example, in the channel structure 281, the semiconductor layer 285 extends vertically from the source side of the channel structure 281 up, and forms a top portion corresponding to a drain side of the vertical memory cell string 280. The top portion of the semiconductor layer 285 is labeled as 285(D). It is noted that the drain side and the source side are named for the ease of description. The drain side and the source side may function differently from the names.

In the FIG. 2 example, a connection structure, such as a via structure 272a with a metal wire 273a, a bonding structure 274, and the like, can be formed to electrically couple the top portion of the semiconductor layer 285(D) to a bit line (BL).

Further in the FIG. 2 example, the staircase region 207 includes a staircase that is formed to facilitate word line connections to the gates of transistors (e.g., memory cells, top select transistor(s), bottom select transistor(s)). For example, a word line connection structure 270 includes a contact structure 271, a via structure 272b, and metal wire 273b that are conductively coupled together. The word line connection structure 270 can electrically couple a WL to a gate terminal of a transistor in the memory cell string 280.

In the FIG. 2 example, the array die 202 and the CMOS die 201 are disposed face-to-face (circuitry side is face, and the substrate side is back) and bonded together. Generally, the peripheral circuitry on the CMOS die interfaces the semiconductor memory device 200 with external circuitry.

In the FIG. 2 example, the CMOS die 201 and the array die 202 respectively include bonding structures that can be aligned with each other. For example the CMOS die 201 includes a bonding structure 234 and the array die 202 includes a corresponding bonding structure 274. The array die 202 and the CMOS die 201 can be suitably aligned, thus the bonding structure 234 is aligned with the bonding structure 274. When the array die 202 and the CMOS die 201 are bonded together, the bonding structure 234 is respectively bonded and electrically coupled with the bonding structure 274.

Figure 3:
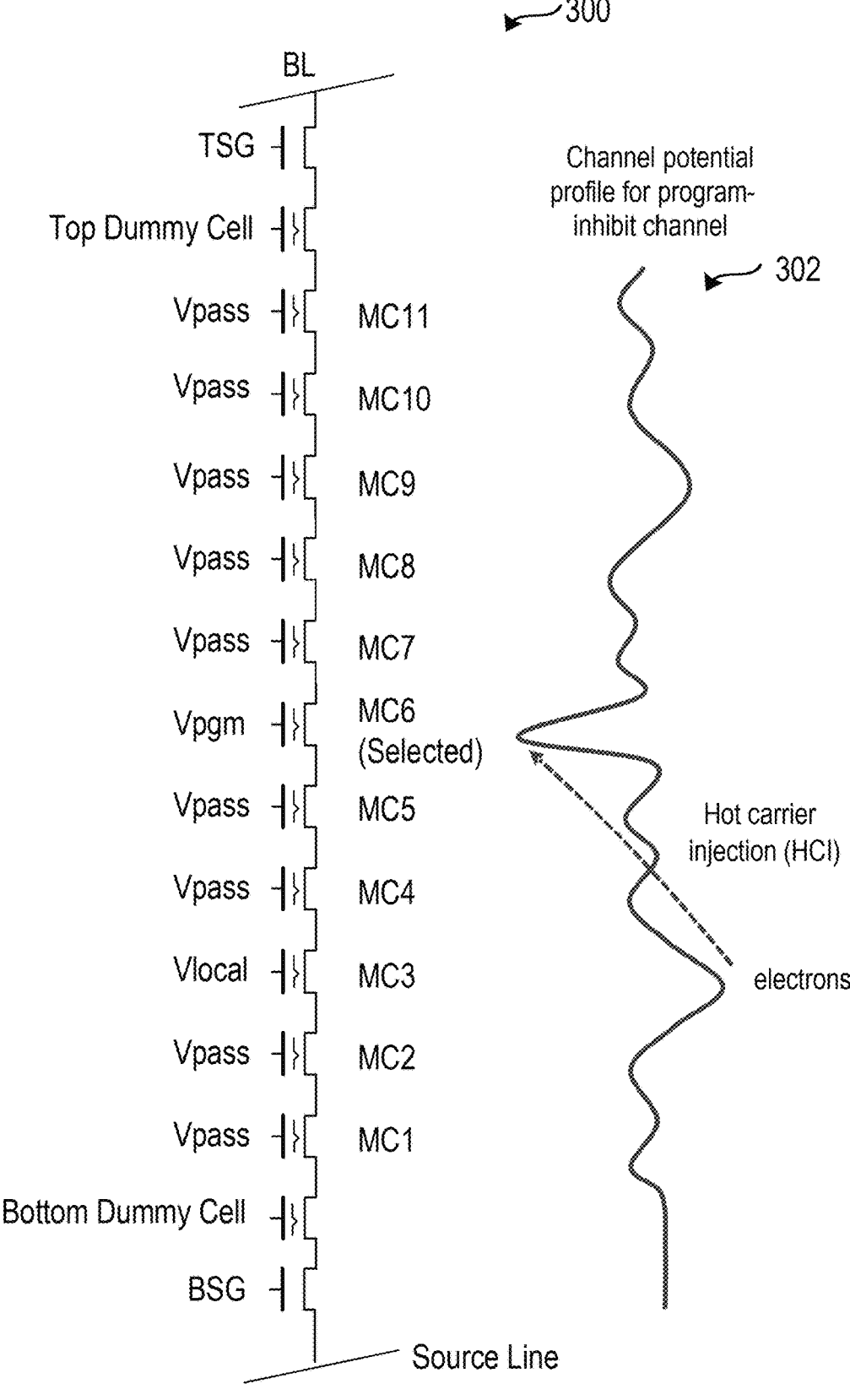
FIG. 3 shows a schematic diagram of programming a memory cell string in a related example according to some exemplary embodiments of the disclosure.

FIG. 3 shows a schematic diagram of programming a memory cell string in a related example according to some exemplary embodiments of the disclosure. As shown in FIG. 3, a memory cell string 300 can include a bottom-select-gate (BSG) transistor, memory cells MC1-MC11 including a selected memory cell MC6 to receive a programming operation, and a top-select-gate (TSG) transistor that are connected in series. The memory cell string 300 can further include a bottom dummy cell adjacent to the BSG transistor, and/or a top dummy cell adjacent to the TSG transistor. When present, the bottom dummy cell can work together with the BSG to control a connection between the memory cell string 300 and the source line. When present, the top dummy cell can work together with the TSG to control a connection between the memory cell string 300 and the bit line. It is noted that FIG. 3 is merely an example, and the memory cell string 300 can include any number of memory cells, one or more bottom dummy cells, and one or more top dummy cells according to the designs of the memory device.

In the related example, the memory cells MC1-MC5, and MC7-MC11 can be previously programmed or can be memory cells not selected for programming, and the selected memory cell MC6 is to be programmed. Thus, a local-boosting operation can be applied on the memory cell string 300 to form program-inhibit channels in the programmed memory cells so that the programmed memory cells can be prevented from being programmed. The local-boosting operation is configured to introduce a Vlocal voltage to electrically isolate charge sharing of channels between the programmed memory cells (e.g., MC1-MC5, and MC7-MC11) and the other remaining memory cells that are selected to be programmed (e.g., MC6). In the local boosting operation, the Vlocal voltage can be a zero volt applied on at least one of the programmed memory cells that is adjacent to the selected memory cell. For example, the Vlocal voltage can be applied on one of the memory cells MC3 and MC9, or both the memory cells MC3 and MC9 that are positioned adjacent to the selected memory cell MC6. Accordingly, a channel cut-off can be formed in the memory cell string 300. For example, when the Vlocal is applied on the MC3, the charge sharing of channels in the memory cell string 300 can be broken by the MC3, and the channels in the memory cell string 300 can be broken into a first portion between the MC1 and MC3, and a second portion between the MC4 and MC11.

When the local-boosting operation is applied, a high channel boosting can be built-up for the programmed memory cells (e.g., MC1-MC5, and MC7-MC11), which can reduce the electrical field across tunneling layers of the channels so that the programming can be inhibited. However, a channel potential difference between the programmed cells and the selected memory cell can be increased, and a severe hot-carrier injection (HCI) can take place from the Vlocal applied memory cell (e.g., MC3) to the selected memory cell (e.g., MC6). The severe hot-carrier injection can further result in a worse program disturbance. In FIG. 2, an exemplary channel potential profile 302 is provided, where the channel potential difference is increased between the selected memory cell MC6 and the Vlocal applied memory cell MC3. A severe hot-carrier injection can take place due to the increased channel potential difference between the selected memory cell MC6 and the Vlocal applied memory cell MC3. For example, electrons in the channel (or charge storage layer of the channel) of the MC3 can be injected into the channel of the memory cell MC6 due to the increased channel potential difference.

In the present disclosure, a bell-shaped pass voltage pattern can be applied when the memory cell string is programmed. In the bell-shaped pass voltage pattern, Vpass voltages that are applied on word lines (WLs) coupled to the memory cells can be modulated along the WLs in a form of a 'bell-shape' that changes starting from word lines of programmed cells (or programmed WLs) in a direction of a drain-side or source-side of the memory cell string. The WLs can be configured to have a plurality of zones, such as a zone 1, a zone 2, and a zone 3 that are defined from a word line of a selected memory cell (also referred to as a selected programmed WL), and each of the plurality of zones can include at least one memory cell. Vpass voltages in the middle zone 2 can be higher than Vpass voltages in zone 1 and zone 3. By enhancing Vpass voltages in zone 2, the potential difference between the programmed WLs and neighboring WLs (e.g., selected programmed WLs) can be suppressed, which in turn can suppress the HCI and result in a better program disturbance.

For example, Vpass voltages can be modulated by placing WLs of zone 1, WLs of zone 2, and WLs of zone 3 downward or upward starting from the selected programmed WL. Further, Vpass voltages in (or applied to) WLs of zone 2 can be higher than Vpass voltages in WLs of zone 3.

In the bell-shaped pass voltage pattern, when Vpass voltages in WLs of zone 2 are higher than Vpass voltages in WLs of zone 3, Vpass voltages in WLs of zone 3 can be sufficiently high to make channels in WLs of zone 2 and channels in WLs of zone 3 to connect to each other during the program-inhibit operation (or programming operation). Thus, the program-inhibit operation of the present disclosure is different from the program-inhibit operation in the related example. As stated above in FIG. 3, in the related example, a Vlocal voltage can be applied to isolate the channels in WLs of zone 2 and the channels in WLs of zone 3. However, in the current disclosure, the channels in WLs of zone 2 and the channels in WLs of zone 3 can still be connected.

In some embodiments, in the bell-shaped pass voltage pattern the interface WLs between zone 2 and zone 3 can have a higher Vpass voltage than a highest program-verify level (e.g., 5 volts) in order to prohibit channels from being isolated between zone 2 and zone 3. In another example, the interface WLs can be driven by ISPP (Incremental step pulse program) and the Vpass voltage at a last program loop of the ISPP can be 1 volt higher than the highest program-verify level.

In some embodiments, the Vpass voltage of (or applied on) zone 2 can be gradually decreased toward zone 2.

In some embodiments, Vpass voltages of zone 1 are smaller than the Vpass voltages of zone 2, and Vpass voltages of zone 2 are larger than Vpass voltages of zone 3.

Figure 4:
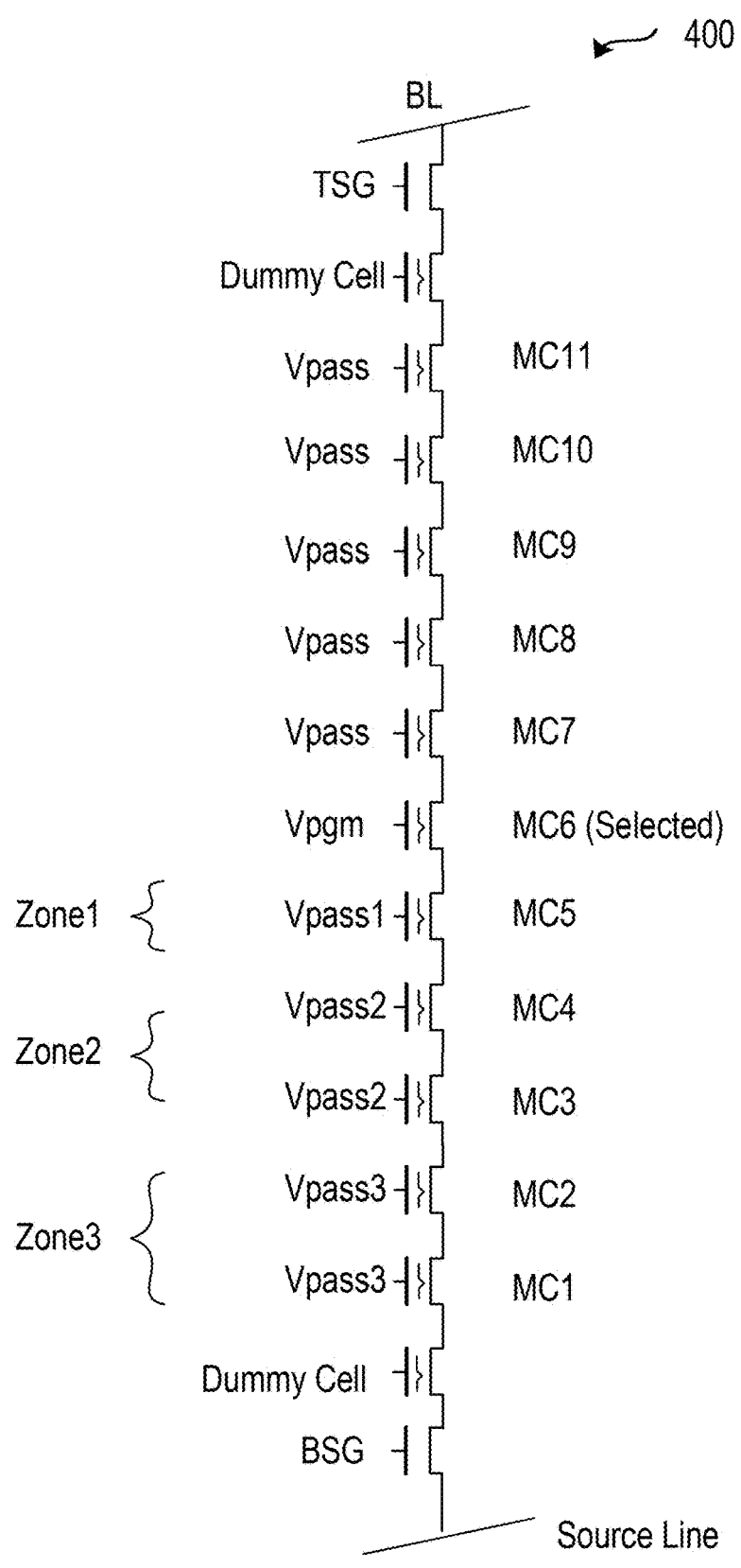
FIG. 4 shows a first schematic diagram of programming a memory cell string according to some exemplary embodiments of the disclosure.

FIGS. 4-8 are exemplary embodiments of the present disclosure that apply the bell-shaped pass voltage pattern in the program-inhibit operation. FIG. 4 shows a first exemplary embodiment of the bell-shaped pass voltage pattern that is applied on a memory cell string 400 to perform a program-inhibit operation. As shown in FIG. 4, the memory cell string 400 can include a selected memory cell MC6 that is selected for programming, and memory cells MC1-MC5 and MC7-MC11 that can already have been programmed or can be memory cells not selected for programming. The memory cells MC1-MC5 can be positioned at a first side (or source side) of the selected memory cell MC6, and the memory cells MC7-MC11 can be positioned at a second side (or drain side) of the selected memory cell MC6. In the example of FIG. 4, the bell-shaped pass voltage pattern can be applied on the memory cells at the first side of the selected memory cell MC6.

Still referring to FIG. 4, a programming voltage Vpgm can be applied on a selected word line for programing the selected memory cell (e.g., MC6), where the selected memory cell MC6 can have a gate terminal coupled to the selected word line. A first pass voltage Vpass 1 can be applied on word lines coupled to memory cells (e.g., MC5) in zone 1 that is located at the first side (or source side) of the selected memory cell in the memory cell string 400. A second pass voltage Vpass 2 can be applied on word lines coupled to memory cells (e.g., MC3 and MC4) in zone 2 located at the first side of the selected memory cell in the memory cell string. A third pass voltage Vpass 3 can be applied on word lines coupled to memory cells (e.g., MC1 and MC2) in zone 3 located at the first side of the selected memory cell in the memory cell string. The second pass voltage Vpass 2 can be higher than the first pass voltage Vpass 1 and the third pass voltage Vpass 3.

It should be noted that FIG. 4 is merely an example. Each of the zone 1, zone 2, and zone 3 can include any number of memory cells according to the structure of the memory cell string 400. Accordingly, the selected memory cell can be any memory cell in the memory cell string 400 starting from a fourth memory cell that is counted from the BSG transistor. Further, voltages can be gradually decreased or increased within a zone. For example, Vpass 2 of zone 2 can gradually be decreased toward the WLs of zone 3. In addition, a pass voltage Vpass can be applied on word lines of (or coupled to) the memory cells (e.g., MC7-MC11) positioned at the second side (or drain side) of the selected memory cell MC6 in the memory cell string 400.

In an exemplary embodiment of FIG. 4, the Vpgm can be in a range from 15 volts to 23 volts. The Vpass can be in a range from 5 volts to 12 volts. The first pass voltage Vpass 1 can be in a range from 3 volts to 9 volts. The second pass voltage Vpass 2 can be in a range from 7 volts to 13 volts. The third pass voltage Vpass 3 can be in a range from 5 volts to 11 volts. It should be noted that, a VCC voltage can be applied on both the bit line and the source line that are coupled to the memory cell string 400. Further, the VCC can be applied on the WL coupled to the TSG transistor, and the WL coupled to the BSG transistor can be grounded. The VCC can be in a range from 1.2 volts to 3.6 volts, for example.

By applying the bell-shaped pass voltage pattern on the memory cell string 400 during the program-inhibit operation, program-inhibit channels can be formed in the programmed memory cells to prevent the programmed memory cell from being programmed again. Further, the channel potential difference between the programmed memory cells and the selected memory cell can be reduced, and the HCI between the programmed memory cells and the selected cell can be prevented.

Figure 5:
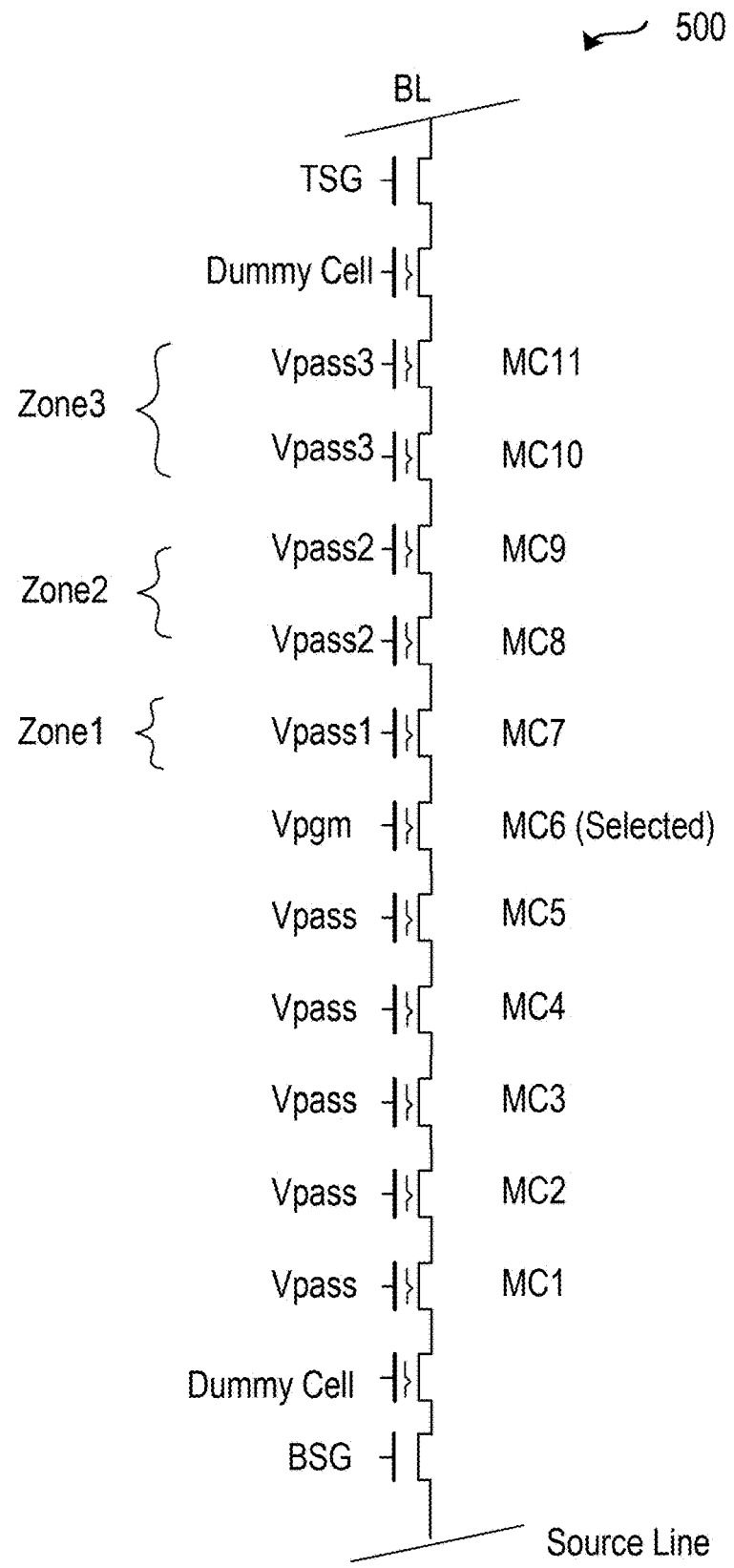
FIG. 5 shows a second schematic diagram of programming a memory cell string according to some exemplary embodiments of the disclosure.

FIG. 5 shows a second exemplary embodiment of the bell-shaped pass voltage pattern that is applied on a memory cell string 500 to perform a program-inhibit operation. As shown in FIG. 5, the memory cell string 500 can include a selected memory cell MC6 that is selected for programming, and memory cells MC1-MC5 and MC7-MC11 that can already have been programmed or can be memory cells not selected for programming. The memory cells MC1-MC5 can be positioned at a first side (or source side) of the selected memory cell MC6, and the memory cells MC7-MC11 can be positioned at a second side (or drain side) of the selected memory cell MC6.

In the example of FIG. 5, the bell-shaped pass voltage pattern can be applied on the memory cells at the second side (or drain side) of the selected memory cell MC6. As shown in FIG. 5, the programming voltage Vpgm can be applied on the selected word line for programing the selected memory cell MC6. The first pass voltage Vpass 1 can be applied on word lines coupled to a memory cell (e.g., MC7) in zone 1 that is located at the second side (or drain side) of the selected memory cell in the memory cell string 500. The second pass voltage Vpass 2 can be applied on word lines coupled to memory cells (e.g., MC8 and MC9) in zone 2 located at the second side of the selected memory cell in the memory cell string 500. The third pass voltage Vpass 3 can be applied on word lines coupled to memory cells (e.g., MC10 and M11) in zone 3 located at the second side of the selected memory cell in the memory cell string 500.

It should be noted each of the zone 1, zone 2, and zone 3 in FIG. 5 can include any number of memory cells according to the structure of the memory cell string 500. Accordingly, the selected memory cell can be any memory cell in the memory cell string 500 starting from a fourth memory cell that is counted from the TSG transistor. Further, voltages can be gradually decreased or increased within a zone. For example, Vpass 2 of zone 2 can gradually be decreased toward the WLs of zone 3. In addition, a pass voltage Vpass can be applied on word lines of (or coupled to) the memory cells (e.g., MC1-MC5) positioned at the first side (or source side) of the selected memory cell MC6 in the memory cell string 500.

In some embodiments, when the selected memory cell is one of the first three memory cells counted from the BSG transistor (e.g., MC1-MC3) or is one of the first three memory cells counted from the TSG transistor (e.g., MC9-MC11), a pass voltage pattern in a related example can be applied. For example, a programming voltage (e.g., Vpgm) can be applied to the selected memory cell and a pass voltage (e.g., Vpass) can be applied to the rest of the memory cells in the memory cell string. In some embodiments, the selected memory cell can further be programmed through the ISPP. Thus, the voltage level of the programming voltage can be adjusted in the programming loops of the ISPP.

Figure 6:
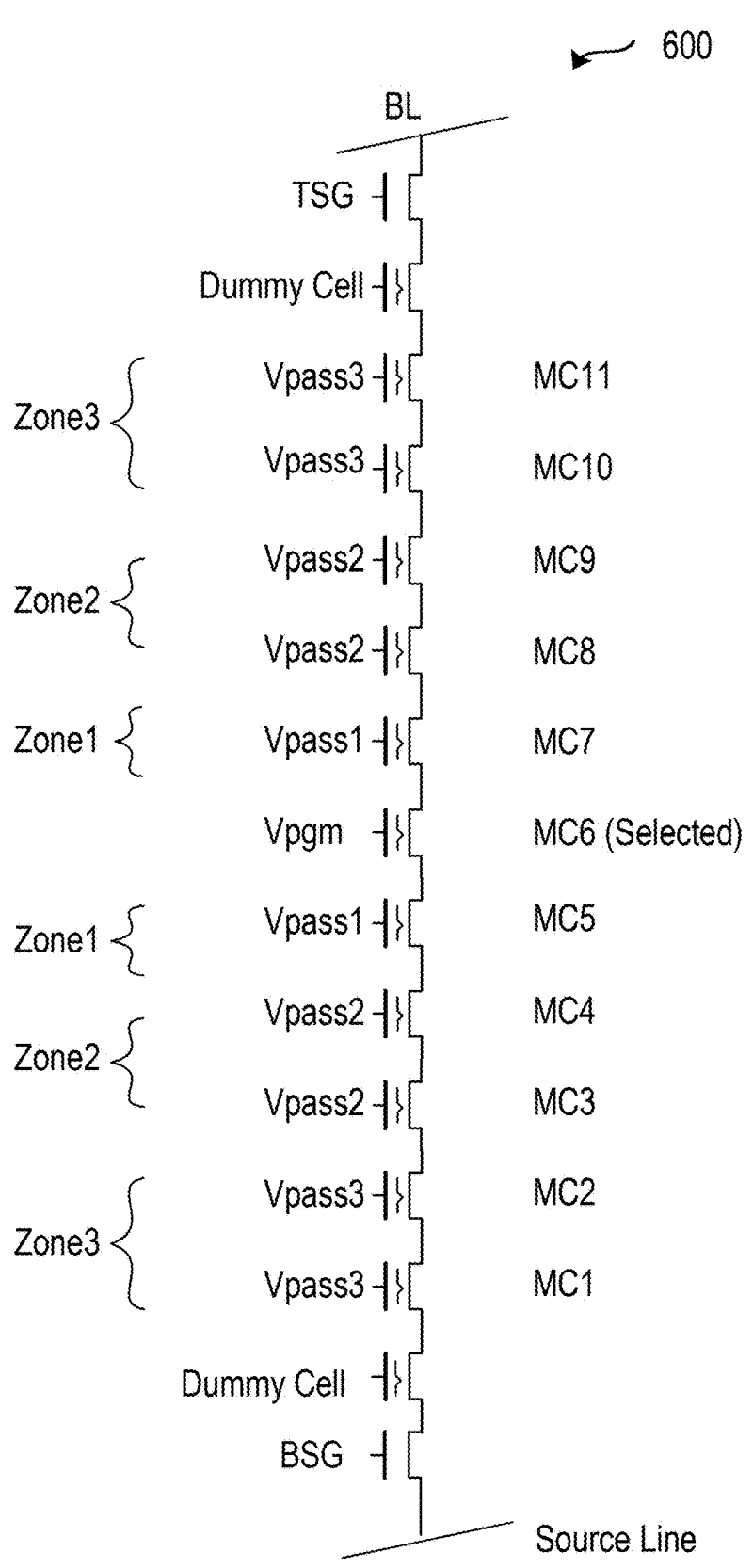
FIG. 6 shows a third schematic diagram of programming a memory cell string according to some exemplary embodiments of the disclosure.

FIG. 6 shows a third exemplary embodiment of the bell-shaped pass voltage pattern that is applied on a memory cell string 600 to perform a program-inhibit operation. As shown in FIG. 6, the bell-shaped pass voltage pattern can be applied on memory cells located at both the first side (or source side) and the second side (or drain side) of a selected memory cell (e.g., MC6). For example, the first pass voltage Vpass 1 can be applied on word lines coupled to memory cells (e.g., MC5 and MC7) in zone 1 that are located at the first side (or source side) and the second side (or drain side) of the selected memory cell in the memory cell string 600. The second pass voltage Vpass 2 can be applied on word lines coupled to memory cells (e.g., MC3-MC4 and MC8-MC9) in zone 2 located at both the first side and the second side of the selected memory cell MC6 in the memory cell string 600. The third pass voltage Vpass 3 can be applied on word lines coupled to memory cells (e.g., MC1-MC2 and MC10-MC11) in zone 3 located at both the first and the second side of the selected memory cell in the memory cell string 600.

Figure 7:
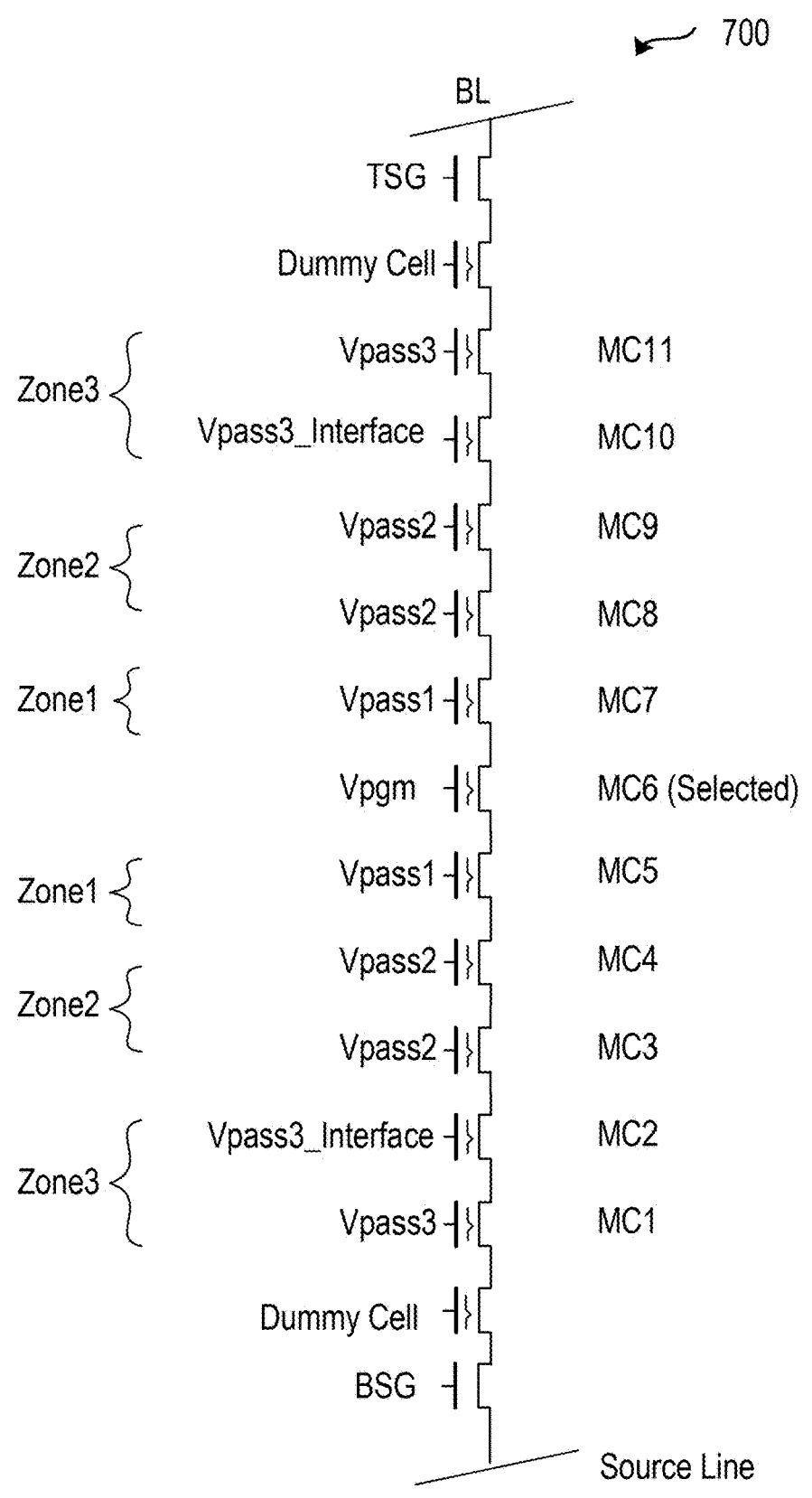
FIG. 7 shows a fourth schematic diagram of programming a memory cell string according to some exemplary embodiments of the disclosure.

In FIG. 7, a fourth exemplary embodiment of the bell-shaped pass voltage pattern is provided, which is applied on a memory cell string 700 to perform a program-inhibit operation. Compared to FIG. 6, an interface pass voltage Vpass3_interface can be applied on WLs coupled to the memory cells (e.g., MC2 and MC10) in zone 3 that are positioned adjacent to the memory cells in zone 2. The interface pass voltage can be in a range between the second pass voltage Vpass 2 and the third pass voltage Vpass 3. For example, the interface pass voltage can be in a range from 8 volts to 10 volts. In FIG. 7, the interface pass voltage can be applied on a first interface WL coupled to a first interface memory cell (e.g., MC2) of the zone 3 at the first side of the selected memory cell MC6, and on a second interface WL coupled to a second interface memory cell (e.g., MC10) of zone 3 at the second side of the selected memory cell. However, FIG. 7 is merely an example, and the interface pass voltage can be applied on one or more memory cells adjacent or closest to the memory cells of zone 2 at the first side, and on one or more memory cells adjacent or closest to the memory cells of zone 2 at the second side.

In another embodiment of FIG. 7, the first pass voltage Vpass 1, the second pass voltage Vpass 2, the third pass voltage Vpass 3, and the interface pass voltage Vpass3_interface can be applied on memory cells at only a first side of a selected memory cell (e.g., MC6) or only a second side of the selected memory cell.

Figure 8:
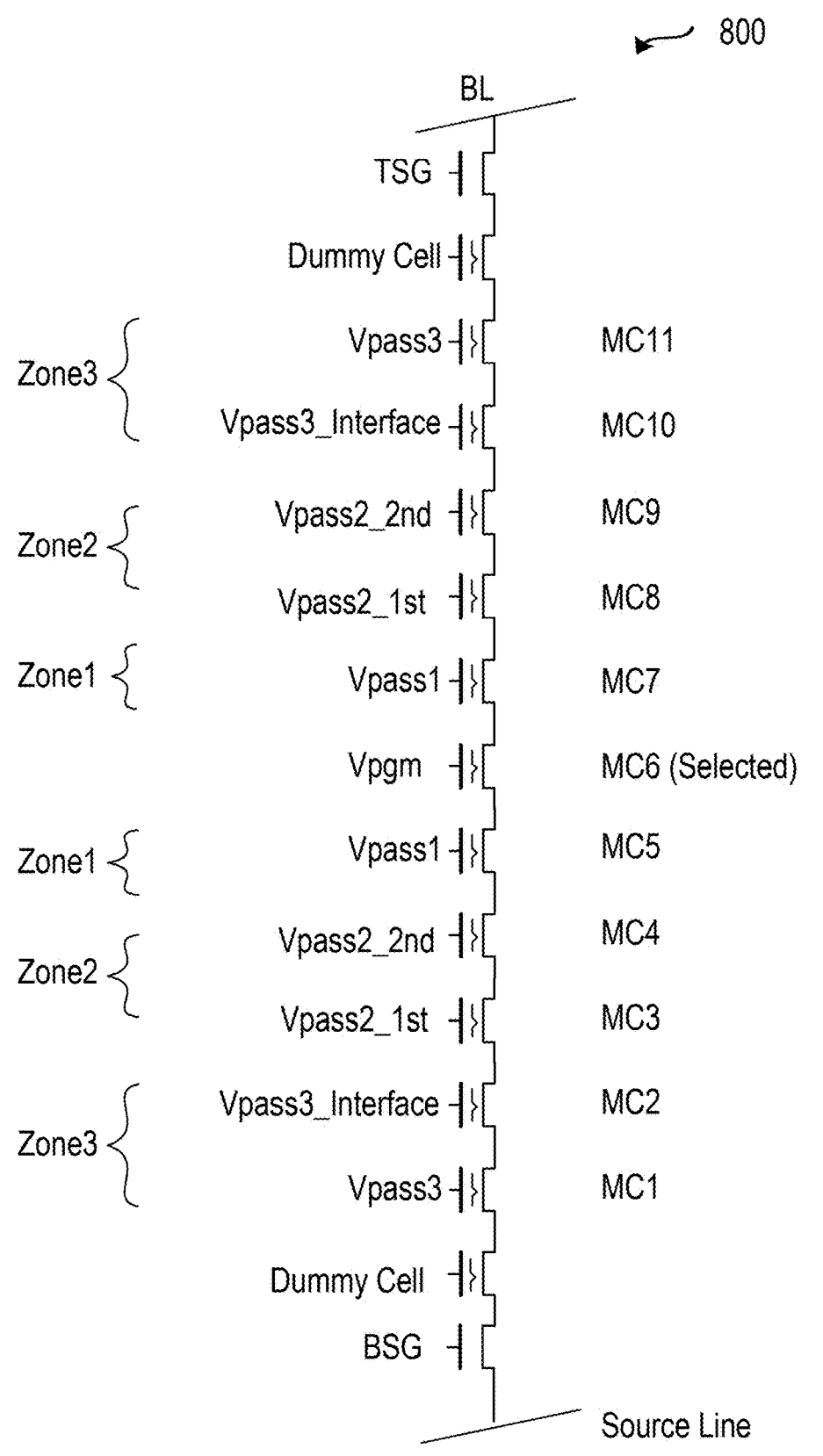
FIG. 8 shows a fifth schematic diagram of programming a memory cell string according to some exemplary embodiments of the disclosure.

FIG. 8 shows a fifth exemplary embodiment of the bell-shaped pass voltage pattern that is applied on a memory cell string 800 to perform the program-inhibit operation. Compared to FIG. 7, the second pass voltage Vpass 2 applied on the WLs of zone 2 can include a plurality of sub second pass voltages (or sub Vpass 2 voltages) that are gradually decreased toward the WLs of zone 3. For example, the second pass voltage Vpass 2 can include two sub second Vpass voltages that are applied on the memory cells of zone 2. For example, a first sub Vpass 2 voltage (e.g., $Vpass2\_1^{st}$) can be applied on the memory cells (e.g., MC4 at the first side and MC8 at the second side) of zone 2 that are adjacent to the memory cells of zone 1. A second sub Vpass 2 voltage $Vpass2\_2^{nd}$ (also referred to as a transition pass voltage) can be applied on the memory cells (e.g., MC3 at the first side and MC9 at the second side) of zone 2 that are disposed adjacent to the memory cells of zone 3. The first sub Vpass 2 voltage can larger than the second sub Vpass 2 voltage. In some embodiments, the first sub Vpass 2 voltage $Vpass2\_1^{st}$ can be in a range from 7 volts to 13 volts, and the second sub Vpass 2 voltage (or transition pass voltage) $Vpass2\_2^{nd}$ can be in a range from 5 volts to 12 volts.

Of course, FIG. 8 is merely an example, and any number of memory cells can be included in zone 1, zone 2, and zone 3 respectively. Accordingly, the first sub Vpass 2 voltage can be applied to any number of memory cells at the first side or at the second side of the selected memory cell in zone 2. The second sub Vpass 2 voltage (or transition pass voltage) can be applied to any number of memory cells at the first side or at the second side of the selected memory cell in zone 2. In addition, the second pass voltage Vpass 2 can include other sub Vpass 2 voltages that are applied to remaining memory cells (e.g., memory cells that are not applied with the $Vpass2\_1^{st}$ and $Vpass2\_2^{nd}$) of zone 2 so that the second pass voltage Vpass 2 applied on the WLs of zone 2 can be gradually decreased toward to the WLs of zone 3.

Still referring to FIG. 8, in some embodiment, the MC5 can be named as a first memory cell, the MC4 can be named as a second memory cell, the MC3 can be named as a first transition memory cell, the MC2 can be named as a first interface memory cell, the MC1 can be named as a third memory cell. In addition, the MC7 can be named as a fourth memory cell, the MC8 can be named as a fifth memory cell, the MC9 can be named as a second transition memory cell, the MC10 can be named as a second interface memory cell, and the MC11 can be named as a sixth memory cell.

Further, the first pass voltage Vpass 1, the first sub Vpass 2 voltage $Vpass2\_1^{st}$, the second sub Vpass 2 voltage (or transition pass voltage) $Vpass2\_2^{nd}$, the third pass voltage Vpass 3, and/or the interface pass voltage Vpass3_interface can be applied on the memory cells at only a first side of a selected memory cell (e.g., MC6) or only a second side of the selected memory cell.

FIG. 9 is a flow chart diagram of a method 900 for programming a memory device including a memory cell string. The memory cell string can include a bottom-select-gate (BSG) transistor, memory cells, and a top-select-gate (TSG) transistor that are connected in series. As shown in FIG. 9, the method 900 can start at S902 and proceed to S904. At S904, a programming voltage can be applied on a selected word line to program a selected memory cell of the memory cells, where the selected memory cell includes a gate terminal coupled to the selected word line.

At S906, a first pass voltage can be applied on a first word line coupled to a first memory cell of the memory cells. The first memory cell can be located at a first side of the selected memory cell in the memory cell string.

At S908, a second pass voltage can be applied on a second word line coupled to a second memory cell of the memory cells, where the second memory cell can be located at the first side of the selected memory cell in the memory cell string.

At S910, a third pass voltage can be applied on a third word line coupled to a third memory cell of the memory cells. The third memory cell can be located at the first side of the selected memory cell in the memory cell string. The second pass voltage can be higher than the first pass voltage and the third pass voltage, and the second memory cell can be disposed between the first memory cell and the third memory cell.

In an embodiment, the first memory cell, the second memory cell, and the third memory cell can be positioned between the selected memory cell and the BSG transistor. A pass voltage can be applied on word lines coupled to the memory cells that are located at a second side of the selected memory cell in the memory cell string and disposed between the selected memory cell and the TSG transistor.

In another embodiment, the first memory cell, the second memory cell, and the third memory cell can be positioned between the selected memory cell and the TSG transistor. Accordingly, the pass voltage can be applied on word lines coupled to the memory cells that are located at a second side of the selected memory cell in the memory cell string and disposed between the selected memory cell and the BSG transistor.

In the method 900, the first pass voltage can be applied on a fourth word line coupled to a fourth memory cell of the memory cells, where the fourth memory cell can be located at a second side of the selected memory cell in the memory cell string. The second pass voltage can be applied on a fifth word line coupled to a fifth memory cell of the memory cells, where the fifth memory cell can be located at the second side of the selected memory cell in the memory cell string. The third pass voltage can be applied on a sixth word line coupled to a sixth memory cell of the memory cells, where the sixth memory cell can be located at the second side of the selected memory cell in the memory cell string. The fifth memory cell can be disposed between the fourth memory cell and the sixth memory cell. In addition, the first memory cell, the second memory cell, and the third memory cell can be disposed between the selected memory cell and the BSG transistor. The fourth memory cell, the fifth memory cell, and the sixth memory cell can be disposed between the selected memory cell and the TSG transistor.

In the method 900, an interface pass voltage can be applied on a first interface word line coupled to a first interface memory cell. The first interface memory cell can be located at the first side of the selected memory cell and disposed between the second memory cell and the third memory cell. Further, the interface pass voltage can be applied on a second interface word line coupled to a second interface memory cell. The second interface memory cell can be located at the second side of the selected memory cell and disposed between the fifth memory cell and the sixth memory cell.

In some embodiments, the interface pass voltage can be in a range between the second pass voltage and the third pass voltage.

In the method 900, a transition pass voltage can be applied on a first transition word line coupled to a first transition memory cell. The first transistor memory can be located at the first side of the selected memory cell and disposed between the second memory cell and the first interface memory cell. The transition pass voltage can further be applied on a second transition word line coupled to a second transition memory cell. The second transition memory cell can be located at the second side of the selected memory cell and disposed between the fifth memory cell and the second interface memory cell.

In some embodiments, the transition pass voltage can be less than the second pass voltage. The first pass voltage can be in a range from 3 volts to 9 volts. The second pass voltage can be in a range from 7 volts to 13 volts. The third pass voltage can be in a range from 5 volts to 11 volts. The programming voltage can be in a range from 15 volts to 23 volts. The interface pass voltage can be in a range from 8 volts to 10 volts. The transition pass voltage can be in a range from 5 volts to 12 volts.

Figure 10:
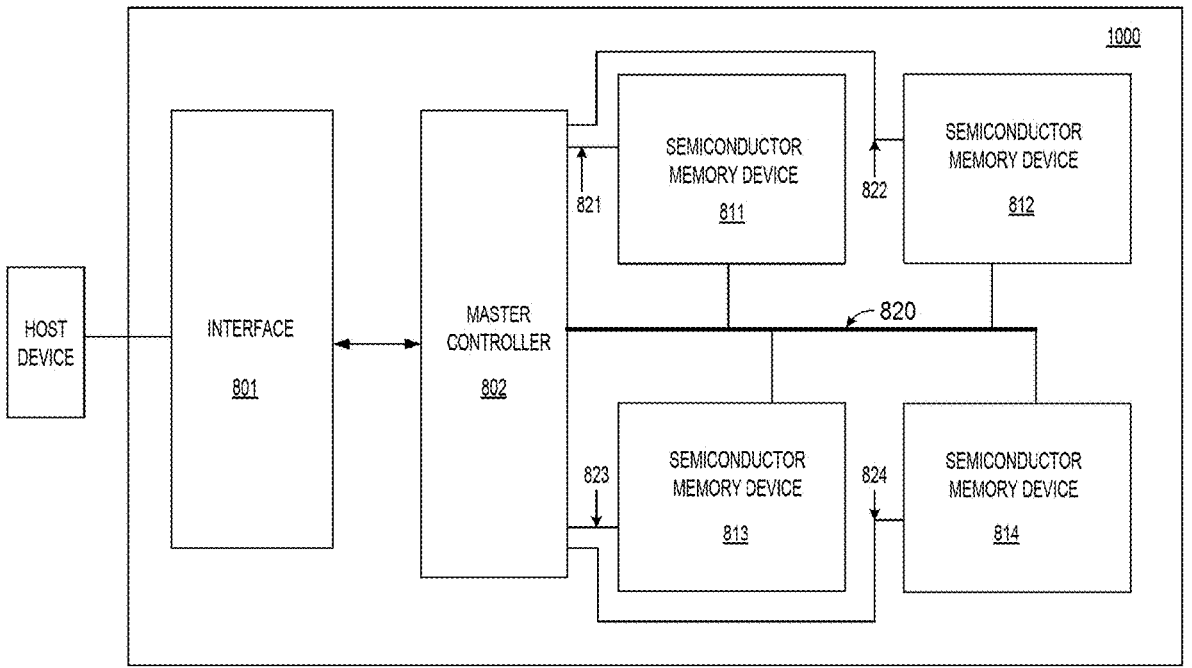
FIG. 10 shows a block diagram of a memory system device according to some exemplary embodiments of the disclosure.

FIG. 10 shows a block diagram of a memory system device 1000 according to some examples of the disclosure. The memory system device 1000 includes one or more semiconductor memory devices, such as shown by semiconductor memory devices 811-814, that can be respectively configured similarly as the semiconductor memory device 100. In some examples, the memory system device 1000 is a solid state drive (SSD) or a memory module.

The memory system device 1000 can include other suitable components. For example, the memory system device 1000 includes an interface (or master interface circuitry) 801 and a master controller (or master control circuitry) 802 coupled together as shown in FIG. 10. The memory system device 1000 can include a bus 820 that couples the master controller 802 with the semiconductor memory devices 811-814. In addition, the master controller 802 is connected with the semiconductor memory devices 811-814 respectively, such as shown by respective control lines 821-824.

The interface 801 is suitably configured mechanically and electrically to connect between the memory system device 1000 and a host device, and can be used to transfer data between the memory system device 1000 and the host device.

The master controller 802 is configured to connect the respective semiconductor memory devices 811-814 to the interface 801 for data transfer. For example, the master controller 802 is configured to provide enable/disable signals respectively to the semiconductor memory devices 811-814 to activate one or more semiconductor memory devices 811-814 for data transfer.

The master controller 802 is responsible for the completion of various instructions within the memory system device 1000. For example, the master controller 802 can perform bad block management, error checking and correction, garbage collection, and the like.

In some embodiments, the master controller 802 is implemented using a processor chip. In some examples, the master controller 802 is implemented using the techniques of programming memory cells based on the bell-shaped pass voltage pattern shown in FIGS. 4-8. In some examples, the master controller 802 is implemented using multiple MCUs, and can be implemented using the techniques of programming memory cells based on the bell-shaped pass voltage pattern shown in FIGS. 4-8.

The various embodiments described herein offer several advantages over methods in related examples to program memory cells of a memory cell string in a 3D-NAND memory device. In related examples, a program-inhibit operation can be performed by isolating the channels of memory cell string, which can result in an elevated channel potential difference between the programmed memory cells and the selected memory cell, and a HCI can take place from the channels of the programmed cells to the channel of the selected memory cell. In the present disclosure, a bell-shaped pass voltage pattern can be applied in that Vpass voltages can be modulated along word lines (WLs) of the memory cell string in a form of 'bell-shape' that changes starting from word lines of programmed cells (or programmed WLs) in a direction of drain-side or source-side of the memory cell string. The WLs are configured to have a zone 1, a zone 2, and a zone 3 that are defined from a word line of a selected memory cell (also referred to as a selected programmed WL), and Vpass voltages in the middle zone 2 can be higher than Vpass voltages in zone 1 and zone 3. By enhancing Vpass voltages in zone 2, the potential difference between the programmed WLs and neighboring WLs (e.g., selected programmed WLs) can be suppressed, which in turn can suppress the HCI and result in a better program disturbance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for programming memory cells of a memory cell string in a memory device, the method comprising:
applying a programming voltage on a selected word line to program a selected memory cell of the memory cells, the selected memory cell having a gate terminal coupled to the selected word line;
applying a first pass voltage on a first word line coupled to a first memory cell of the memory cells located at a first side of the selected memory cell in the memory cell string;
applying a second pass voltage on a second word line coupled to a second memory cell of the memory cells located at the first side of the selected memory cell in the memory cell string;
applying a third pass voltage on a third word line coupled to a third memory cell of the memory cells located at the first side of the selected memory cell in the memory cell string, the second pass voltage being higher than the first pass voltage and the third pass voltage, and the second memory cell being disposed between the first memory cell and the third memory cell; and
applying an interface pass voltage on a first interface word line coupled to a first interface memory cell that is located at the first side of the selected memory cell and disposed between the second memory cell and the third memory cell,
wherein:
the interface pass voltage is in a range between the second pass voltage and the third pass voltage.

2. The method of claim 1, wherein the memory cell string further comprises a bottom-select-gate (BSG) transistor and a top-select-gate (TSG) transistor, the BSG transistor, the memory cells, and the TSG transistor being connected in series.

3. The method of claim 2, wherein the first memory cell, the second memory cell, and the third memory cell are positioned between the selected memory cell and the BSG transistor, the method further comprising:
applying a pass voltage on word lines coupled to the memory cells that are located at a second side of the selected memory cell in the memory cell string and disposed between the selected memory cell and the TSG transistor.

4. The method of claim 2, wherein the first memory cell, the second memory cell, and the third memory cell are positioned between the selected memory cell and the TSG transistor, the method further comprising:
applying a pass voltage on word lines coupled to the memory cells that are located at a second side of the selected memory cell in the memory cell string and disposed between the selected memory cell and the BSG transistor.

5. The method of claim 2, further comprising:
applying the first pass voltage on a fourth word line coupled to a fourth memory cell of the memory cells located at a second side of the selected memory cell in the memory cell string;
applying the second pass voltage on a fifth word line coupled to a fifth memory cell of the memory cells located at the second side of the selected memory cell in the memory cell string; and
applying the third pass voltage on a sixth word line coupled to a sixth memory cell of the memory cells located at the second side of the selected memory cell in the memory cell string, the fifth memory cell being disposed between the fourth memory cell and the sixth memory cell.

6. The method of claim 5, wherein:
the first memory cell, the second memory cell, and the third memory cell are disposed between the selected memory cell and the BSG transistor, and
the fourth memory cell, the fifth memory cell, and the sixth memory cell are disposed between the selected memory cell and the TSG transistor.

7. The method of claim 6, further comprising:
applying the interface pass voltage on a second interface word line coupled to a second interface memory cell that is located at the second side of the selected memory cell and disposed between the fifth memory cell and the sixth memory cell.

8. The method of claim 7, further comprising:
applying a transition pass voltage on a first transition word line coupled to a first transition memory cell that is located at the first side of the selected memory cell and disposed between the second memory cell and the first interface memory cell; and
applying the transition pass voltage on a second transition word line coupled to a second transition memory cell that is located at the second side of the selected memory cell and disposed between the fifth memory cell and the second interface memory cell.

9. The method of claim 8, wherein:
the transition pass voltage is less than the second pass voltage,
the first pass voltage is in a range from 3 volts to 9 volts,
the second pass voltage is in a range from 7 volts to 13 volts,
the third pass voltage is in a range from 5 volts to 11 volts,

the programming voltage is in a range from 15 volts to 23 volts,
the interface pass voltage is in a range from 8 volts to 10 volts, and
the transition pass voltage is in a range from 5 volts to 12 volts.

10. The method of claim 1, wherein:
the interface pass voltage is larger than a highest program-verify voltage that is applied on the selected memory cell when the selected memory cell is verified, and
the interface pass voltage at a last program loop of an incremental step pulse program to program the selected memory cell is one volt higher than the highest program-verify voltage.

11. A memory device, comprising:
a memory cell string formed of memory cells including a selected memory cell;
a voltage generator coupled to the memory cell string; and
a controller configured to:
apply a programming voltage generated by the voltage generator through an address decoding circuit on a selected word line for programing the selected memory cell of the memory cells, the selected memory cell having a gate terminal coupled to the selected word line;
apply a first pass voltage generated by the voltage generator through the address decoding circuit on a first word line coupled to a first memory cell of the memory cells located at a first side of the selected memory cell in the memory cell string;
apply a second pass voltage generated by the voltage generator through the address decoding circuit on a second word line coupled to a second memory cell of the memory cells located at the first side of the selected memory cell in the memory cell string;
apply a third pass voltage generated by the voltage generator through the address decoding circuit on a third word line coupled to a third memory cell of the memory cells located at the first side of the selected memory cell in the memory cell string, the second pass voltage being higher than the first pass voltage and the third pass voltage, and the second memory cell being disposed between the first memory cell and the third memory cell; and
apply an interface pass voltage generated by the voltage generator through the address decoding circuit on a first interface word line coupled to a first interface memory cell that is located at the first side of the selected memory cell and disposed between the second memory cell and the third memory cell, wherein:
the interface pass voltage is in a range between the second pass voltage and the third pass voltage.

12. The memory device of claim 11, wherein the memory cell string further comprises a bottom-select-gate (BSG) transistor and a top-select-gate (TSG) transistor, the BSG transistor, the memory cells, and the TSG transistor being connected in series.

13. The memory device of claim 12, wherein the first memory cell, the second memory cell, and the third memory cell are positioned between the selected memory cell and the BSG transistor, the controller is further configured to:
apply a pass voltage generated by the voltage generator through the address decoding circuit on word lines coupled to the memory cells that are located at a second side of the selected memory cell in the memory cell string and disposed between the selected memory cell and the TSG transistor.

14. The memory device of claim 12, wherein the first memory cell, the second memory cell, and the third memory cell are positioned between the selected memory cell and the TSG transistor, the controller is further configured to:
apply a pass voltage generated by the voltage generator through the address decoding circuit on word lines coupled to the memory cells that are located at a second side of the selected memory cell in the memory cell string and disposed between the selected memory cell and the BSG transistor.

15. The memory device of claim 12, wherein the controller is further configured to:
apply the first pass voltage through the address decoding circuit on a fourth word line coupled to a fourth memory cell of the memory cells located at a second side of the selected memory cell in the memory cell string;
apply the second pass voltage through the address decoding circuit on a fifth word line coupled to a fifth memory cell of the memory cells located at the second side of the selected memory cell in the memory cell string; and
apply the third pass voltage through the address decoding circuit on a sixth word line coupled to a sixth memory cell of the memory cells located at the second side of the selected memory cell in the memory cell string, the fifth memory cell being disposed between the fourth memory cell and the sixth memory cell.

16. The memory device of claim 15, wherein:
the first memory cell, the second memory cell, and the third memory cell are disposed between the selected memory cell and the BSG transistor, and
the fourth memory cell, the fifth memory cell, and the sixth memory cell are disposed between the selected memory cell and the TSG transistor.

17. The memory device of claim 16, wherein the controller is further configured to:
apply the interface pass voltage through the address decoding circuit on a second interface word line coupled to a second interface memory cell that is located at the second side of the selected memory cell and disposed between the fifth memory cell and the sixth memory cell.

18. The memory device of claim 17, wherein:
the interface pass voltage is larger than a highest program-verify voltage that is applied on the selected memory cell when the selected memory cell is verified, and
the interface pass voltage at a last program loop of an incremental step pulse program to program the selected memory cell is one volt higher than the highest program-verify voltage.

19. The memory device of claim 17, wherein the controller is further configured to:
apply a transition pass voltage generated by the voltage generator through the address decoding circuit on a first transition word line coupled to a first transition memory cell that is located at the first side of the selected memory cell and disposed between the second memory cell and the first interface memory cell; and
apply the transition pass voltage through the address decoding circuit on a second transition word line coupled to a second transition memory cell that is located at the second side of the selected memory cell and disposed between the fifth memory cell and the second interface memory cell, wherein the transition pass voltage is less than the second pass voltage.

20. A memory system device, comprising:

a plurality of memory devices;

master control circuitry coupled with the plurality of memory devices and configured to operate one or more memory devices of the plurality of memory devices for data generation and data transfer; and interface circuitry coupled with the master control circuitry and configured to transfer data between the master control circuitry and an external device, wherein a memory device of the plurality of memory devices includes:

a memory cell string formed of memory cells including a selected memory cell;

a voltage generator coupled to the memory cell string; and a controller configured to:

apply a programming voltage generated by the voltage generator through an address decoding circuit on a selected word line for programing the selected memory cell of the memory cells, the selected memory cell having a gate terminal coupled to the selected word line;

apply a first pass voltage generated by the voltage generator through the address decoding circuit on a first word line coupled to a first memory cell of the memory cells located at a first side of the selected memory cell in the memory cell string;

apply a second pass voltage generated by the voltage generator through the address decoding circuit on a second word line coupled to a second memory coll of the memory cells located at the first side of the selected memory cell in the memory cell string;

apply a third pass voltage generated by the voltage generator through the address decoding circuit on a third word line coupled to a third memory cell of the memory cells located at the first side of the selected memory cell in the memory cell string, the second pass voltage being higher than the first pass voltage and the third pass voltage, and the second memory cell being disposed between the first memory cell and the third memory cell; and apply an interface pass voltage generated by the voltage generator through the address decoding circuit on a first interface word line coupled to a first interface memory cell that is located at the first side of the selected memory cell and disposed between the second memory cell and the third memory cell, wherein:

the interface pass voltage is in a range between the second pass voltage and the third pass voltage.

* * * * *